(12) United States Patent
Harris et al.

(10) Patent No.: US 12,038,604 B2
(45) Date of Patent: Jul. 16, 2024

(54) PHOTONIC COMMUNICATION PLATFORM

(71) Applicant: Lightmatter, Inc., Boston, MA (US)

(72) Inventors: Nicholas C. Harris, Menlo Park, CA (US); Carl Ramey, Westborough, MA (US); Michael Gould, La Honda, CA (US); Thomas Graham, Cambridge, MA (US); Darius Bunandar, Boston, MA (US); Ryan Braid, Cambridge, MA (US); Mykhailo Tymchenko, Melrose, MA (US)

(73) Assignee: Lightmatter, Inc., Boston, MA (US)

( * ) Notice: Subject to any disclaimer, the term of this patent is extended or adjusted under 35 U.S.C. 154(b) by 0 days.

(21) Appl. No.: 18/526,652

(22) Filed: Dec. 1, 2023

(65) Prior Publication Data

US 2024/0103219 A1 Mar. 28, 2024

Related U.S. Application Data

(60) Continuation of application No. 18/455,395, filed on Aug. 24, 2023, which is a continuation of application
(Continued)

(51) Int. Cl.
*G02B 6/12* (2006.01)
*G02B 6/122* (2006.01)
(Continued)

(52) U.S. Cl.
CPC ....... *G02B 6/1225* (2013.01); *G02B 6/12004* (2013.01); *G02B 6/12007* (2013.01);
(Continued)

(58) Field of Classification Search
None
See application file for complete search history.

(56) References Cited

U.S. PATENT DOCUMENTS

| 5,416,861 A | 5/1995 | Koh et al. |
| 5,771,323 A | 6/1998 | Trott |

(Continued)

FOREIGN PATENT DOCUMENTS

| CN | 104092500 A | 10/2014 |
| CN | 106817323 A | 6/2017 |

(Continued)

OTHER PUBLICATIONS

International Search Report and Written Opinion mailed Nov. 29, 2023, in connection with International Application No. PCT/US23/65007.

(Continued)

*Primary Examiner* — Chad H Smith
(74) *Attorney, Agent, or Firm* — Wolf, Greenfield & Sacks, P.C.

(57) ABSTRACT

Described herein are photonic communication platforms that can overcome the memory bottleneck problem, thereby enabling scaling of memory capacity and bandwidth well beyond what is possible with conventional computing systems. Some embodiments provide photonic communication platforms that involve use of photonic modules. Each photonic module includes programmable photonic circuits for placing the module in optical communication with other modules based on the needs of a particular application. The architecture developed by the inventors relies on the use of common photomask sets (or at least one common photomask) to fabricate multiple photonic modules in a single wafer. Photonic modules in multiple wafers can be linked together into a communication platform using optical or electronic means.

20 Claims, 27 Drawing Sheets

Related U.S. Application Data

No. 18/356,680, filed on Jul. 21, 2023, which is a continuation of application No. 17/313,415, filed on May 6, 2021, now Pat. No. 11,754,783, which is a division of application No. 16/810,573, filed on Mar. 5, 2020, now Pat. No. 11,036,002.

(60) Provisional application No. 62/961,448, filed on Jan. 15, 2020, provisional application No. 62/923,889, filed on Oct. 21, 2019, provisional application No. 62/814,444, filed on Mar. 6, 2019.

(51) Int. Cl.
| | |
|---|---|
| *G02B 6/13* | (2006.01) |
| *G02B 6/136* | (2006.01) |
| *H01L 21/027* | (2006.01) |
| *H04J 14/02* | (2006.01) |

(52) U.S. Cl.
CPC .............. *G02B 6/13* (2013.01); *G02B 6/136* (2013.01); *H01L 21/0275* (2013.01); *H04J 14/02* (2013.01)

(56) References Cited

U.S. PATENT DOCUMENTS

| | | | |
|---|---|---|---|
| 5,930,429 | A | 7/1999 | Trott |
| 6,202,165 | B1 | 3/2001 | Pine |
| 6,477,285 | B1 | 11/2002 | Shanley |
| 7,251,386 | B1 | 7/2007 | Dickinson et al. |
| 7,310,459 | B1 | 12/2007 | Rahman |
| 7,894,699 | B2 | 2/2011 | Beausoleil |
| 8,450,186 | B2 | 5/2013 | Rong et al. |
| 9,671,572 | B2 | 6/2017 | Decker et al. |
| 9,922,887 | B2 | 3/2018 | Vermeulen et al. |
| 10,847,467 | B2 | 11/2020 | Collins et al. |
| 11,036,002 | B2 | 6/2021 | Harris et al. |
| 11,754,783 | B2 | 9/2023 | Harris et al. |
| 11,860,413 | B2 | 1/2024 | Harris et al. |
| 2002/0028045 | A1 | 3/2002 | Yoshimura et al. |
| 2004/0258408 | A1 | 12/2004 | Ramaswami et al. |
| 2005/0224946 | A1 | 10/2005 | Dutta |
| 2007/0280585 | A1 | 12/2007 | Warashina et al. |
| 2008/0044128 | A1 | 2/2008 | Kish, Jr. et al. |
| 2008/0089640 | A1 | 4/2008 | Beausoleil |
| 2009/0103345 | A1 | 4/2009 | Mclaren et al. |
| 2009/0103855 | A1 | 4/2009 | Binkert et al. |
| 2010/0054671 | A1 | 3/2010 | Ban et al. |
| 2011/0052120 | A1 | 3/2011 | Tan et al. |
| 2011/0073989 | A1 | 3/2011 | Rong et al. |
| 2011/0128790 | A1 | 6/2011 | Sarin et al. |
| 2011/0269456 | A1 | 11/2011 | Krishnaswamy et al. |
| 2012/0149148 | A1 | 6/2012 | Dallesasse et al. |
| 2012/0177381 | A1 | 7/2012 | Dobbelaere et al. |
| 2012/0203695 | A1 | 8/2012 | Morgan et al. |
| 2013/0051725 | A1 | 2/2013 | Shinoda et al. |
| 2013/0071121 | A1 | 3/2013 | Sharapov et al. |
| 2013/0156366 | A1 | 6/2013 | Raj et al. |
| 2013/0209112 | A1 | 8/2013 | Witzens |
| 2013/0243429 | A1 | 9/2013 | Whelihan et al. |
| 2013/0292840 | A1 | 11/2013 | Shoemaker et al. |
| 2013/0308893 | A1 | 11/2013 | Zuffada et al. |
| 2014/0040698 | A1 | 2/2014 | Loh et al. |
| 2014/0043050 | A1 | 2/2014 | Stone et al. |
| 2014/0264400 | A1* | 9/2014 | Lipson ................... H01L 25/50 257/432 |
| 2014/0268980 | A1 | 9/2014 | Kim et al. |
| 2014/0294342 | A1 | 10/2014 | Offrein et al. |
| 2014/0300008 | A1 | 10/2014 | Duan et al. |
| 2014/0363124 | A1 | 12/2014 | Pelley et al. |
| 2014/0363172 | A1 | 12/2014 | Pelley et al. |
| 2015/0381273 | A1 | 12/2015 | Gloeckner et al. |
| 2016/0085038 | A1 | 3/2016 | Decker et al. |
| 2016/0181322 | A1 | 6/2016 | Mazed et al. |
| 2016/0191188 | A1 | 6/2016 | Butler |
| 2016/0216445 | A1 | 7/2016 | Thacker et al. |
| 2016/0252688 | A1 | 9/2016 | Barwicz et al. |
| 2017/0108655 | A1 | 4/2017 | Zarbock et al. |
| 2017/0160474 | A1 | 6/2017 | Mahmoodian et al. |
| 2017/0194309 | A1 | 7/2017 | Evans et al. |
| 2018/0045885 | A1 | 2/2018 | Canali et al. |
| 2019/0162901 | A1 | 5/2019 | Yu et al. |
| 2019/0189603 | A1 | 6/2019 | Wang et al. |
| 2019/0310433 | A1 | 10/2019 | Yoo et al. |
| 2019/0335252 | A1 | 10/2019 | Ryan |
| 2019/0363797 | A1 | 11/2019 | Peterson et al. |
| 2020/0006304 | A1 | 1/2020 | Chang et al. |
| 2020/0111720 | A1 | 4/2020 | Wan et al. |
| 2020/0284981 | A1 | 9/2020 | Harris et al. |
| 2021/0096311 | A1 | 4/2021 | Yu et al. |
| 2021/0118853 | A1 | 4/2021 | Harris et al. |
| 2021/0202562 | A1 | 7/2021 | Chang et al. |
| 2021/0215897 | A1 | 7/2021 | Epitaux et al. |
| 2021/0242124 | A1 | 8/2021 | Kannan et al. |
| 2021/0278590 | A1 | 9/2021 | Harris et al. |
| 2021/0375829 | A1 | 12/2021 | Or-Bach et al. |
| 2022/0109075 | A1 | 4/2022 | Byrd et al. |
| 2022/0148627 | A1 | 5/2022 | Meade et al. |
| 2023/0085268 | A1 | 3/2023 | Harris et al. |
| 2023/0114842 | A1 | 4/2023 | Harris et al. |
| 2023/0114847 | A1 | 4/2023 | Harris et al. |
| 2023/0308188 | A1 | 9/2023 | Dorta-Quinones et al. |
| 2023/0314711 | A1 | 10/2023 | Eslampour et al. |
| 2023/0314742 | A1 | 10/2023 | Dorta-Quinones et al. |
| 2023/0358957 | A1 | 11/2023 | Harris et al. |
| 2023/0388024 | A1 | 11/2023 | Tymchenko et al. |
| 2023/0400632 | A1 | 12/2023 | Harris et al. |
| 2023/0408764 | A1 | 12/2023 | Harris et al. |

FOREIGN PATENT DOCUMENTS

| | | | |
|---|---|---|---|
| EP | 0547262 | A1 | 6/1993 |
| EP | 2 212 887 | A1 | 8/2010 |
| EP | 3 159 721 | A1 | 4/2017 |
| JP | H0798463 | A | 4/1995 |
| JP | 2005-502127 | A | 1/2005 |
| JP | 2011-503760 | A | 1/2011 |
| JP | 2011501238 | A | 1/2011 |
| JP | 2015-062027 | A | 4/2015 |
| JP | 2018-506072 | A | 3/2018 |
| JP | 2018-093007 | A | 6/2018 |
| JP | 2018-195723 | A | 12/2018 |
| KR | 10-2010-0095515 | A | 8/2010 |
| TW | 508834 | B | 11/2002 |
| WO | 2011/143548 | A2 | 11/2011 |
| WO | 2016/008771 | A1 | 1/2016 |
| WO | 2019/132970 | A1 | 7/2019 |

OTHER PUBLICATIONS

Singapore Search Report and Written Opinion dated Dec. 1, 2023, in connection with Singapore Application No. 11202108868T.
Orcutt et al., Open foundry platform for high-performance electronic-photonic integration. Optics Express. May 21, 2012;20(11). 11 Pages.
PCT/US23/65007, Nov. 29, 2023, International Search Report and Written Opinion.
11202108868T, Dec. 1, 2023, Singapore Search Report and Written Opinion.
Invitation to Pay Additional Fees mailed Jun. 19, 2019, in connection with International Application No. PCT/US2019/029803.
International Search Report and Written Opinion mailed Sep. 3, 2019, in connection with International Application No. PCT/US2019/029803.
Invitation to Pay Additional Fees mailed May 1, 2020, in connection with International Application No. PCT/US2020/021209.
International Search Report and Written Opinion mailed Jul. 6, 2020, in connection with International Application No. PCT/US2020/021209.

(56) References Cited

OTHER PUBLICATIONS

International Preliminary Report on Patentability mailed Nov. 26, 2020, in connection with International Application No. PCT/US2019/029803.
International Search Report and Written Opinion mailed Apr. 14, 2021, in connection with International Application No. PCT/US2021/016129.
International Preliminary Report on Patentability mailed Sep. 16, 2021, in connection with International Application No. PCT/US2020/021209.
Extended European Search Report dated Feb. 11, 2022, in connection with European Application No. 19803311.0.
Singapore Search Report and Written Opinion mailed May 13, 2022, in connection with Singapore Application No. 11202011400P.
Extended European Search Report dated Nov. 4, 2022, in connection with European Application No. 20766814.6.
International Preliminary Report on Patentability mailed Aug. 18, 2022, in connection with International Application No. PCT/US2021/016129.
International Search Report and Written Opinion mailed Jan. 18, 2023, in connection with International Application No. PCT/US2022/046379.
Invitation to Pay Additional Fees mailed Nov. 7, 2022, in connection with International Application No. PCT/US2022/043209.
International Search Report and Written Opinion mailed Jan. 26, 2023, in connection with International Application No. PCT/US2022/043209.
Invitation to Pay Additional Fees dated Aug. 25, 2023, in connection with International Application No. PCT/US2023/065007.
Beausoleil et al., Nanoelectronic and nanophotonic interconnect. Proceedings of the IEEE. Feb. 2008;96(2):230-47. doi:10.1109/JPROC.2007.911057.
Fujikata et al., LSI on-chip optical interconnection with Si nanophotonics. Extended Abstracts of the 2007 International Conference on Solid State Devices and Materials. 2007. pp. 276-277.
Grigalunas, Tell Me—What Is Wafer Dicing? Eastern States Components, LLC. Sep. 26, 2017. 2 pages. URL:https://www.escomponents.com/blog/2017/9/26/tell-me-what-is-wafer-dicing [retrieved Jul. 13, 2020].
Udipi et al., Combining memory and a controller with photonics through 3D-stacking to enable scalable and energy-efficient systems. 38th Annual International Symposium on Computer Architecture (ISCA). Jun. 8, 2011;425-436.
Wada, Electronics and Photonics Convergence on Si CMOS Platform. Proc. of SPIE. 2004; 5357:16-24.
Young et al., Optical technology for energy efficient I/O in high performance computing. IEEE Communications Magazine. Oct. 2010; 48:184-91.
International Search Report and Written Opinion dated Feb. 28, 2024, in connection with International Application No. PCT/US23/80883.
Extended European Search Report dated Feb. 19, 2024, in connection with European Application No. 21750009.9.
Bell, Shane et al., TILE64—Processor: A 64-Core SoC with Mesh Interconnect, 2008 International Solid-State Circuits Conference—Digest of Technical Papers, 200802. pp. 1-3. DOI:10.1109/ISSCC.2008.4523070.

* cited by examiner

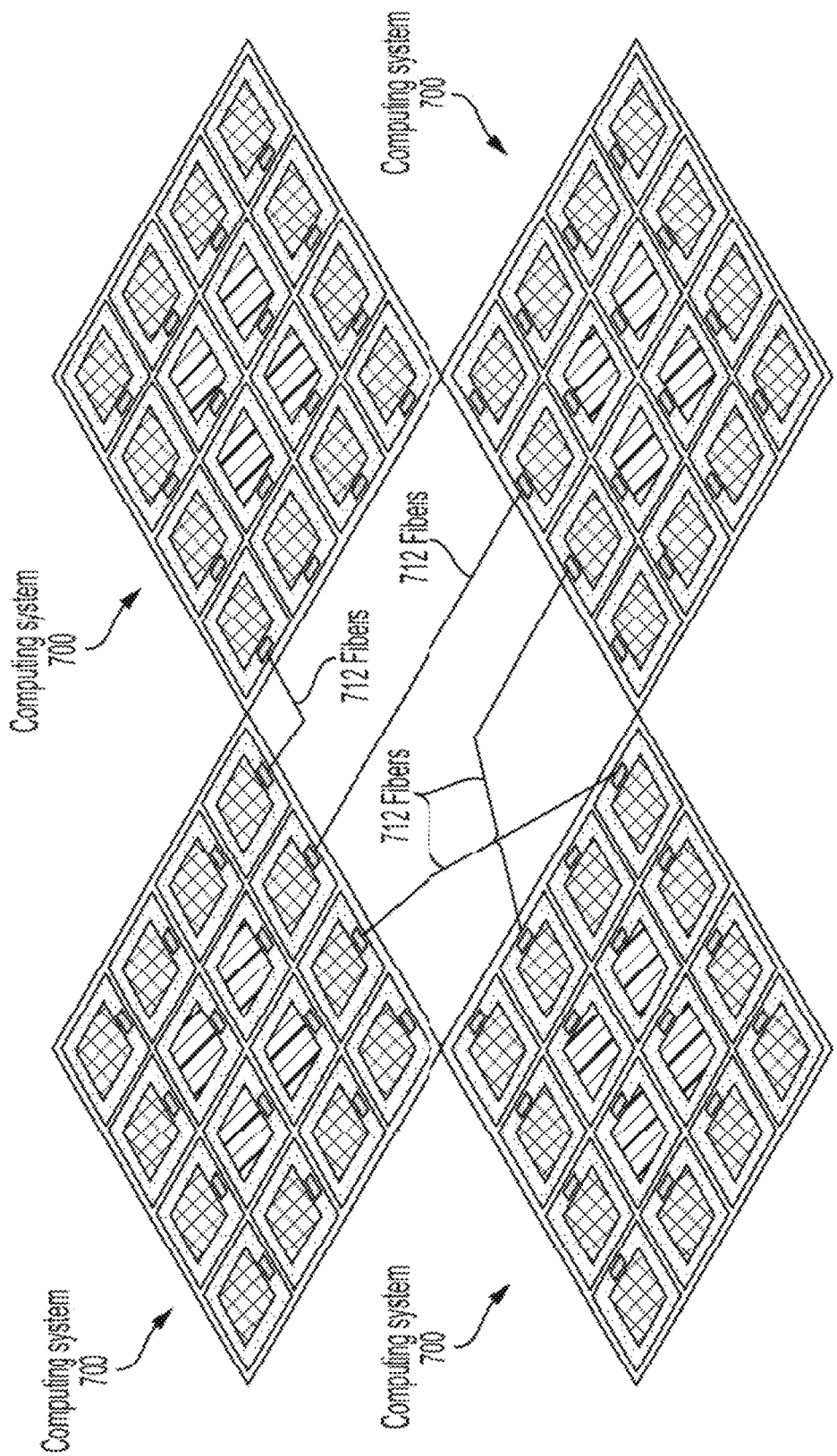

PHOTONIC COMMUNICATION PLATFORM

CROSS-REFERENCE TO RELATED APPLICATIONS

The present application is a Continuation claiming the benefit under 35 U.S.C. § 120 of U.S. patent application Ser. No. 18/455,395, filed Aug. 24, 2023, and entitled "PHOTONIC COMMUNICATION PLATFORM," which is a Continuation claiming the benefit under 35 U.S.C. § 120 of U.S. patent application Ser. No. 18/356,680, filed Jul. 21, 2023, and entitled "PHOTONIC COMMUNICATIONS PLATFORM," which is a Continuation claiming the benefit under 35 U.S.C. § 120 of U.S. patent application Ser. No. 17/313,415, filed May 6, 2021, and entitled "PHOTONIC COMMUNICATIONS PLATFORM," which is a Divisional claiming the benefit under 35 U.S.C. § 120 of U.S. patent application Ser. No. 16/810,573, filed Mar. 5, 2020, and entitled "PHOTONIC COMMUNICATION PLATFORM," which claims the benefit under 35 U.S.C. § 119(e) of U.S. Provisional patent application Ser. No. 62/961,448, entitled "PHOTONICS COMMUNICATIONS PLATFORM WITH SINGLE LITHOGRAPHIC MASK SET," filed on Jan. 15, 2020; U.S. Provisional patent application Ser. No. 62/923,889, entitled "PHOTONICS COMMUNICATIONS PLATFORM WITH SINGLE LITHOGRAPHIC MASK SET," filed on Oct. 21, 2019; and U.S. Provisional patent application Ser. No. 62/814,444, entitled "PHOTONICS COMMUNICATIONS PLATFORM WITH LITHOGRAPHIC MASK SET," filed on Mar. 6, 2019, each of which is hereby incorporated herein by reference in its entirety.

BACKGROUND

Computer systems include random-access memories (RAM) for storing data and machine code. RAMs are typically volatile memories, such that the stored information is lost when power is removed. In modern implementations, memories take the form of integrated circuits. Each integrated circuit includes several memory cells. To enable access to stored data and machine code, memories are place in electrical communication with processors. Typically, these electrical communications are implemented as metal traces formed on the substrates on which the memories and the processors are disposed.

SUMMARY OF THE DISCLOSURE

Some embodiments relate to a photonic system comprising a plurality of photonic modules including at least first and second photonic modules patterned according to at least one common photomask. Each of the first and second photonic modules comprises first and second boundaries; an optical distribution network; a first optical waveguide optically coupling the optical distribution network to a first neighboring photonic module of the plurality of photonic modules, the first neighboring photonic module being adjacent to the first boundary; and a second optical waveguide optically coupling the optical distribution network to a second neighboring photonic module of the plurality of photonic modules, the second neighboring photonic module being adjacent to the second boundary.

In some embodiments, the first and second boundaries are opposite to one another.

In some embodiments, the first and second optical waveguides are patterned according to the at least one common photomask.

In some embodiments, each of the first and second photonic modules further comprises an out-of-plane optical coupler optically coupled to the optical distribution network.

In some embodiments, the optical distribution network is configured to selectively place the first neighboring photonic module in optical communication with the second neighboring photonic module.

In some embodiments, each of the first and second photonic modules is patterned according to a common set of photomasks, wherein the at least one common photomask is part of the common set of photomasks.

In some embodiments, each of the first and second photonic modules further comprises: third and fourth boundaries, wherein the first and second boundaries are opposite to one another and the third and fourth boundaries are opposite to one another; a third optical waveguide optically coupling the optical distribution network to a third neighboring photonic module of the plurality of photonic modules, the third neighboring photonic module being adjacent to the third boundary; and a fourth optical waveguide optically coupling the optical distribution network to a fourth neighboring photonic module of the plurality of photonic modules, the fourth neighboring photonic module being adjacent to the fourth boundary.

In some embodiments, the optical distribution network is configured to selectively place the first neighboring photonic module in optical communication with the second neighboring photonic module or the third neighboring photonic module.

In some embodiments, the optical distribution network comprises a plurality of optical switches.

In some embodiments, the first and second photonic modules are adjacent to one another such that the second photonic module is the first neighboring photonic module for the first photonic module.

Some embodiments relate to a method for manufacturing a semiconductor wafer comprising: patterning each of at least some of a plurality of photonic modules on the semiconductor wafer using at least one common photomask, wherein patterning each of at least some of the plurality of photonic modules comprises: patterning an optical distribution network; patterning a first optical waveguide optically coupling the optical distribution network to a first neighboring photonic module of the plurality of photonic modules, the first neighboring photonic module being adjacent to a first boundary of the photonic module; and patterning a second optical waveguide optically coupling the optical distribution network to a second neighboring photonic module of the plurality of photonic modules, the second neighboring photonic module being adjacent to a second boundary of the photonic module.

In some embodiments, patterning each of at least some of the plurality of photonic modules comprises patterning the first and second optical waveguides using the at least one common photomask.

In some embodiments, the method further comprises dicing the semiconductor wafer to obtain a photonic substrate comprising: a first photonic module of the plurality of photonic modules; a first neighboring photonic module adjacent to the first boundary of the first photonic module; and a second neighboring photonic module adjacent to the second boundary of the first photonic module.

In some embodiments, the first and second boundaries of the first photonic module are opposite to one another.

In some embodiments, patterning each of at the at least some of the plurality of photonic modules further comprises: patterning a third optical waveguide optically coupling the optical distribution network to a third neighboring photonic module of the plurality of photonic modules, the third neighboring photonic module being adjacent to a third boundary of the photonic module; and patterning a fourth optical waveguide optically coupling the optical distribution network to a fourth neighboring photonic module of the plurality of photonic modules, the fourth neighboring photonic module being adjacent to a fourth boundary of the photonic module. The first and second boundaries are opposite to one another and the third and fourth boundaries are opposite to one another.

In some embodiments, patterning each of at least some of the plurality of photonic modules further comprises: patterning a first photonic module using a first photolithography shot in connection with the at least one common photomask; and patterning a second photonic module using a second photolithography shot, subsequent to the first photolithography shot, in connection with the at least one common photomask.

Some embodiments relate to a computing system comprising a photonic substrate patterned with a plurality of photonic modules including at least first and second photonic modules, each of the first and second photonic modules being patterned according to at least one common photomask, wherein the first photonic module is optically coupled to the second photonic module; a first die in communication with the first photonic module; and a second die in communication with the second photonic module.

In some embodiments, the first die comprises a processor and the second die comprises a memory.

In some embodiments, the computing system further comprises a laser die coupled to the photonic substrate.

In some embodiments, each of the first and second photonic modules comprises: first and second boundaries; an optical distribution network; a first optical waveguide optically coupling the optical distribution network to a first neighboring photonic module of the plurality of photonic modules, the first neighboring photonic module being adjacent to the first boundary; and a second optical waveguide optically coupling the optical distribution network to a second neighboring photonic module of the plurality of photonic modules, the second neighboring photonic module being adjacent to the second boundary.

In some embodiments, the first and second boundaries are opposite to one another.

In some embodiments, the first and second optical waveguides are patterned according to the at least one common photomask.

In some embodiments, each of the first and second photonic module comprises an out-of-plane optical coupler, wherein: the first die is optically coupled to the out-of-plane optical coupler of the first photonic module, and the second die is optically coupled to the out-of-plane optical coupler of the second photonic module.

In some embodiments, the first die is coupled to a first side of the photonic substrate and the second die is coupled to a second side of the photonic substrate opposite the first side.

In some embodiments, the computing system further comprises a third die stacked on top of the first die.

In some embodiments, the first and second photonic modules share a boundary such that the first photonic module is adjacent to the second photonic module.

In some embodiments, the first die is mounted above or below the first photonic module; and the second die is mounted above or below the second photonic module.

In some embodiments, the first die is in electronic communication with the first photonic module, and the second die is in electronic communication with the second photonic module.

Some embodiments relate to a multi-node computing system comprising: a plurality of computing systems including at least first and second computing systems, each of the first and second computing systems comprising: a photonic substrate patterned with a plurality of photonic modules including at least first and second photonic modules, each of the first and second photonic modules being patterned according to at least one common photomask, wherein the first photonic module is optically coupled to the second photonic module; a first die in communication with the first photonic module; a second die in communication with the second photonic module; and a fiber connecting the first and second computing systems to one another.

In some embodiments, each of the first and second computing systems further comprises a fiber coupler, wherein the fiber optically couples respective fiber couplers of the first and second computing systems to one another.

In some embodiments, the first die comprises a processor and the second die comprises a memory.

In some embodiments, each of the first and second computing systems further comprises a laser coupled to the photonic substrate.

In some embodiments, each of the first and second photonic modules of the photonic substrate comprises: first and second boundaries; an optical distribution network; a first optical waveguide optically coupling the optical distribution network to a first neighboring photonic module of the plurality of photonic modules, the first neighboring photonic module being adjacent to the first boundary; and a second optical waveguide optically coupling the optical distribution network to a second neighboring photonic module of the plurality of photonic modules, the second neighboring photonic module being adjacent to the second boundary.

In some embodiments, the first and second optical waveguides are patterned according to the at least one common photomask.

In some embodiments, each of the first and second photonic modules comprises an out-of-plane optical coupler, wherein: the first die is optically coupled to the out-of-plane optical coupler of the first photonic module, and the second die is optically coupled to the out-of-plane optical coupler of the second photonic module.

In some embodiments, the first die is coupled to a first side of the photonic substrate and the second die is coupled to a second side of the photonic substrate opposite the first side.

In some embodiments, the multi-node computing system further comprises a third die stacked on top of the first die.

In some embodiments, the first and second photonic modules share a boundary such that the first photonic module is adjacent to the second photonic module.

In some embodiments, the first die is mounted above or below the first photonic module; and the second die is mounted above or below the second photonic module.

Some embodiments relate to a photonic communication platform comprising: a photonic network comprising a plurality of optical switches formed on a semiconductor substrate; a plurality of dies in communication with the photonic network; an electronic switching network comprising a plurality of transistors co-integrated with the plurality of optical switches, the electronic switching network being configured to: at a first time, program the optical switches to form a first optical communication path coupling together a first subset of the plurality of dies, and at a second time subsequent to the first time, program the optical switches to form a second optical communication path coupling together a second subset of the plurality of dies, the second optical communication path being distinct from the first communication path.

In some embodiments, the plurality of transistors are formed on the semiconductor substrate.

In some embodiments, the semiconductor substrate is a first semiconductor substrate, and wherein the plurality of transistors are formed on a second semiconductor substrate, wherein the first and second semiconductor substrates are 3D-bonded together.

In some embodiments, programming the optical switches to form a first optical communication path comprises: identifying an optical communication path coupling together first subset of the plurality of dies; and programming the optical switches based on the identified optical communication path.

In some embodiments, identifying an optical communication path coupling together first subset of the plurality of dies comprises monitoring a usage of the photonic network.

In some embodiments, the electronic switching network is further configured to determine at least one characteristic of an optical signal at the first optical communication path; identify an encoding scheme based on the at least one characteristic of the optical signal; and cause the photonic network to communicate optically on the first optical communication path based on the encoding scheme.

In some embodiments, the plurality of dies are in electronic communication with the photonic network.

In some embodiments, the electronic switching network is further configured to cause the photonic network to communicate optically on the first optical communication path using wavelength division multiplexing.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in the figures in which they appear.

FIG. 8B illustrates a multi-node computing system including a plurality of computing systems of the type illustrated in FIG. 8A, in accordance with some embodiments.

DETAILED DESCRIPTION

I. Scalability of Memory Bandwidth

Figure 1:
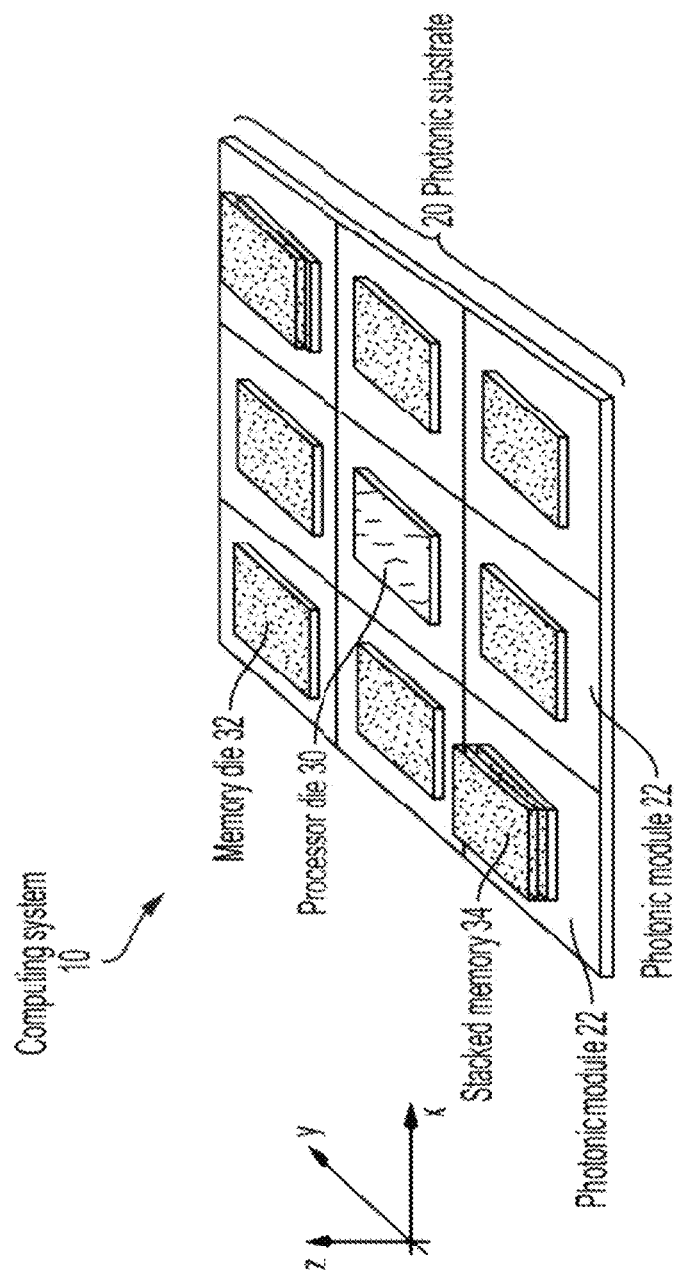
FIG. 1 illustrates a computing system based on a photonic communication platform, in accordance with some embodiments.

The inventors have recognized and appreciated that one of the major bottlenecks limiting the spread of data-intensive computing is the inability to scale memory capacity and bandwidth in modern computers at sufficiently high rates. The inventors have developed photonic communication platforms that enable scaling of memory capacity and bandwidth well beyond what is possible with conventional computers.

Data-intensive computing systems, such as those designed to handle deep learning algorithms, require access to vast amounts of data, thus increasing the requirements for memory capacity. Further, most applications require access to data in real time or quasi real time, thus increasing the requirements for memory bandwidth. Some conventional computing systems utilize graphical processing units (GPUs) to improve memory access efficiency. Some GPUs transfer data from a memory at bandwidths as high as 256 GB/s. While such a memory bandwidth may be sufficient for most graphic-based applications, this is far from being enough for data-intensive applications such as deep neural networks and high-frequency trading.

Deep neural networks rely on large numbers of parameters such as weights and activation parameters. A typical 50-layer network with 26 million weight parameters, for example, can compute up to 16 million activations in a forward pass. If weight and activation parameters are stored using 32-bit floating point values, the total storage requirement is 168 MB. In addition, if data are represented as dense vectors, the memory requirement can increase to several gigabytes. During training, locality of the training dataset is important because of the frequency of access to these large datasets. These amounts of data are far too large to be stored in the internal memory of the GPU, thereby requiring use of several external dynamic random access memories (DRAMs). Each DRAM chip communicates with a processor through electronic communication carriers. For example, in computing systems that utilize silicon interposers, in which the processor and the memory chips are mounted on the same interposer, memory-processor communication is supported by conductive traces formed on the interposer. Use of silicon interposers has become widespread in recent years because the densities of conductive traces that an interposer can provide is much larger than in printed circuit boards (PCBs). However, interposers cannot be scaled indefinitely. Interposers, being manufactured using microfabrication techniques, have limited areas, thus limiting the numbers of memory chips that an interposer can accommodate.

Moreover, the presence of parasitic impedance further limits the bandwidth scalability. Ideally, the impedance of the interposer's conductive traces would be negligible. In reality, unfortunately, the impedance of the traces is significant. The parasitic impedance limits bandwidth scalability in two ways. First, it limits the bandwidth that a trace can support. Second, it increases power consumption. To make things worse, parasitic impedance increases with the length of a trace, meaning that the larger the separation between a memory chip and a processor, the lower the bandwidth. This is why conventional computing systems are typically designed so that memory chips are positioned within a few centimeters of the processor. However, there are only so many memory chips that can be accommodated within this range. The result is that conventional computing systems are limited in both memory bandwidth and memory capacity.

II. Overview of Photonic Communication Platforms

The communication platforms developed by the inventors overcome these limitations using photonics. The physics according to which light propagates inside a waveguide makes optical communications inherently immune to parasitic impedance. The immunity to parasitic impedance leads to a major benefit—it removes the requirement that memory chips be positioned within a certain range of the processor.

Another advantage of the photonic communication platforms developed by the inventors is that they can be easily adapted to different computer architectures. Single-node computer architectures involve one processor chip, which may have more than one processor core per chip, and several memory chips. Multi-node computer architectures involve several processor chips and several memory chips. Some multi-node architectures use a ring topology—each processor is in direct communication with two neighboring processors and communication with other processors passes through the neighboring processors. Other multi-node architectures use a star topology—a central hub is responsible for routing core-to-core communications. Yet another multi-node architectures use a multi-cast topology—each processor is in directed communication to several other processors.

Some aspects of the photonic communication platforms described herein make them easily adaptable to any one of these architectures (and others). Some embodiments provide photonic communication platforms that use "photonic modules." Each photonic module includes programmable photonic circuits that can be configured based on the needs of a particular computer architecture. Some platforms are arranged according to 1-dimensional schemes, such as in blocks of 3×1 modules, in blocks of 5×1 modules, in blocks of 10×1 modules, 20×1 modules, etc. Some platforms are arranged according to 2-dimensional schemes, such as in blocks of 3×3 modules, in blocks of 5×3 modules, in blocks of 5×5 modules, in blocks of 10×10 modules, etc. More generally, the platforms enable any block of N×M modules, where N≥1 and M≥1, and any topology, such as T-topologies, L-topologies, X-topologies, etc. Each photonic module can serve as a node of a computing system. At each node, there may be one or more digital processor chips, one or more analog accelerators, one or more photonic accelerators, one or more memory chips, one or more networking chips, or other devices.

FIG. 1 illustrates an example computing system based on a photonic communication platform with nine photonic modules arranged in a 3×3 topology, in accordance with one example. Computing system 10 includes a photonic substrate 20 patterned with nine photonic modules 22 (also referred to herein as "photonic sites," or simply "sites"). This photonic communication platform supports one processor die (30) positioned in the middle of photonic substrate 20, and eight memory nodes surrounding the processor die. Some of the memory nodes include a single memory chip (see for example memory die 32). Other memory nodes include a stacked memory including multiple vertically-stacked memory dies (see for example stacked memory 34). The dies can communicate with the photonic module electronically (e.g., using through-silicon vias, copper pillars, micro-bumps, ball-grid arrays or other electrical interconnects) and/or optically (e.g., using grating couplers, prisms, lenses or other optical couplers).

As described in detail further below, the photonic modules are patterned with optical waveguides and optical distribution networks. The optical distribution network of a photonic module can selectively place the die of that particular photonic module in optical communication with any other die of the computing system. For example, the optical distribution network of the photonic module positioned under processor die 30 may be reconfigured depending on the needs of the processor. At the beginning of a routine, the processor may need to access data stored in a first memory node. This read operation involves configuring the respective optical distribution networks to place the processor in optical communication with the first memory node. Later in the routine, the processor may need to write data into a second memory node. This write operation involves reconfiguring the optical distribution networks to place the processor in optical communication with the second memory node.

The inventors have further appreciated that manufacturing photonic modules in large scales can be costly. The photonic communication platforms described herein are engineered in a way that limits manufacturing costs. These platforms rely on the use of common photomask sets (or at least one common photomask) to fabricate multiple photonic modules. This approach reduces costs in two ways. First, it reduces additional costs that would otherwise be incurred in procuring several different photomask sets. Second, it enables fabrication of photonic modules using standard semiconductor foundries, some of which require that the same photomask set (or at least one photomask) be used across an entire wafer. Designing photonic modules that share at least one photomask enables fabrication of many photonic modules on the same semiconductor wafer while leveraging standard, low-cost step-and-repeat manufacturing processes.

III. Photonic Modules

The photonic modules described herein may be manufactured using microfabrication techniques, including for example complementary metal-oxide-semiconductor (CMOS) microfabrication techniques. Accordingly, some embodiments relate to silicon photonics-based optical communication platforms. Some particular microfabrication techniques involve step-and-repeat approaches—whereby stepper machines are used to pattern a semiconductor wafer with multiple copies of a template layout. FIG. 2A through FIG. 2E illustrate microfabrication techniques for manufacturing photonic modules. FIGS. 3A through 3F illustrate examples of photonic modules patterned using these microfabrication techniques.

Figure 2A:
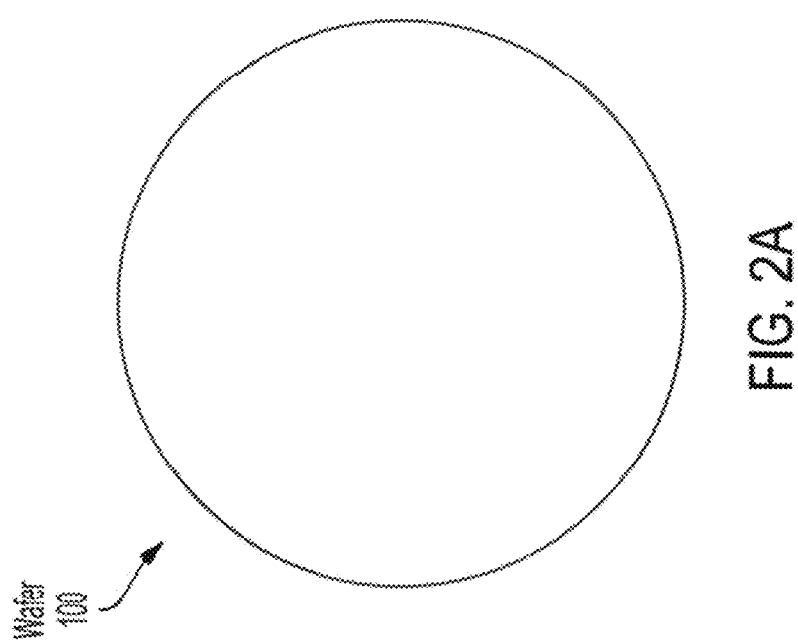
FIG. 2A illustrates a semiconductor wafer, in accordance with some embodiments.

Referring first to FIG. 2A, this figure illustrates a semiconductor wafer 100. Wafer 100 may be made of any material. For example, wafer 100 may be made of (or otherwise include) silicon. In one example, wafer 100 is a silicon-on-insulator (SOI) wafer. In another example, wafer 100 is a bulk silicon wafer. Wafer 100 may have any size. For example, the diameter of wafer 100 may be 150 mm, 300 nm, or 450 mm, among other possible values. However, not all wafers need to have a circular shape.

Figure 2B:
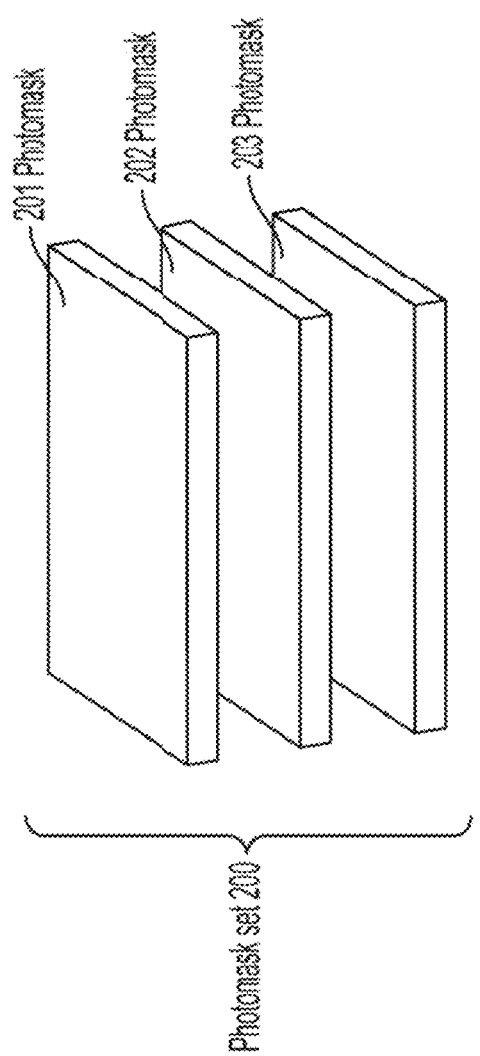
FIG. 2B illustrates a set of photomasks, in accordance with some embodiments.

FIG. 2B illustrates a set of photomasks that may be used for patterning wafer 100 using photolithographic techniques. Photomask set 200 includes three photomasks (201, 202 and 203), though other sets may include more or fewer photomasks. Each photomask has a particular pattern of opaque and transparent regions. When the photomask is exposed to light, the opaque regions block the light, thereby preventing it from shining a wafer, and the transparent regions allow passage of the light. The result is that the pattern of the photomask is transferred to the wafer.

Figure 2C:
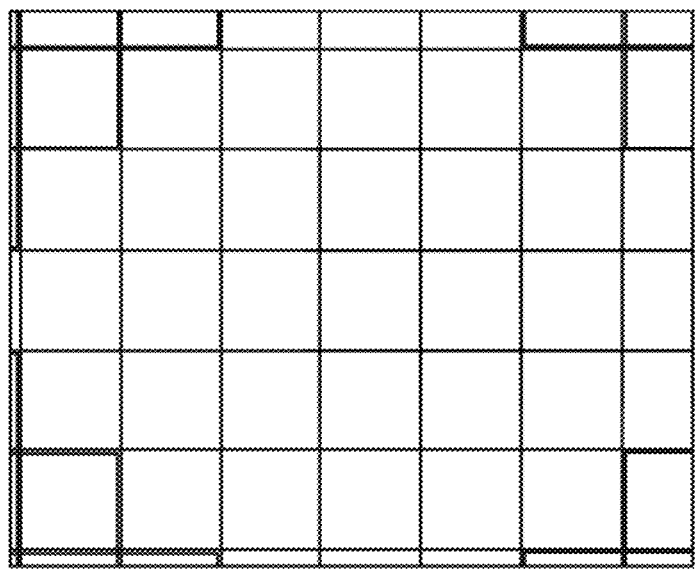
FIG. 2C illustrates an example photomask for forming optical waveguides, in accordance with some embodiments.

Each photomask may define a particular layer of a photonic module. One photomask may be used to define optical waveguides. When the wafer goes through an etch process, only the exposed regions (or only the non-exposed regions) are etched away, while the other regions remain un-etched. This photomask may be patterned to form a network of optical waveguides when the wafer is exposed to light through this photomask. FIG. 2C illustrates a portion of a photomask that may be used to form waveguides on wafer 100. The lines of photomask 201 represent opaque regions. The background of photomask 201 is transparent. Exposure of photomask 201 to light so that an image of the photomask is projected onto wafer 100 enables patterning of waveguides in the shapes of the opaque regions. In this particular example, the pattern of lines of the photomask results in a grid of waveguides.

Some photonic modules involve use of different levels of optical waveguides. In some such embodiments, photomask set 200 may include a dedicated photomask for each waveguide level. Another photomask may be used to define n-doped regions. When the wafer goes through an ion implantation or dopant diffusion process, only the exposed regions (or only the non-exposed regions) receive the doping, while the other regions remain undoped. Another photomask may be used to define p-doped regions using a similar process. Some photonic modules involve use of different doping concentrations. In some such embodiments, photomask set 200 may include a dedicated photomask for each doping concentration. In other embodiments, photomask set 200 may include photomasks used to define deposition of semiconductor materials other than silicon, such as germanium and/or other materials of the periodic table, such as Groups III or V. Another photomask may be used to define metal contacts. Another photomask may be used to define metal traces. Some photonic modules involve use of different levels of metal traces. In some such embodiments, photomask set 200 may include a dedicated photomask for each metal trace level.

In some embodiments, wafer 100 is patterned in a step-and-repeat fashion. When wafer 100 is processed in a stepper machine, the pattern of a photomask is exposed repeatedly across the surface of the wafer, in a grid. This process involves moving the wafer in steps back and forth and left and right under the lens of the stepper, and exposing the photomask at each step. The result is that wafer 100 is patterned with multiple copies of the pattern defined by a photomask. This operation may be repeated for each photomask (or at least some photomasks) of the set.

Figure 2D:
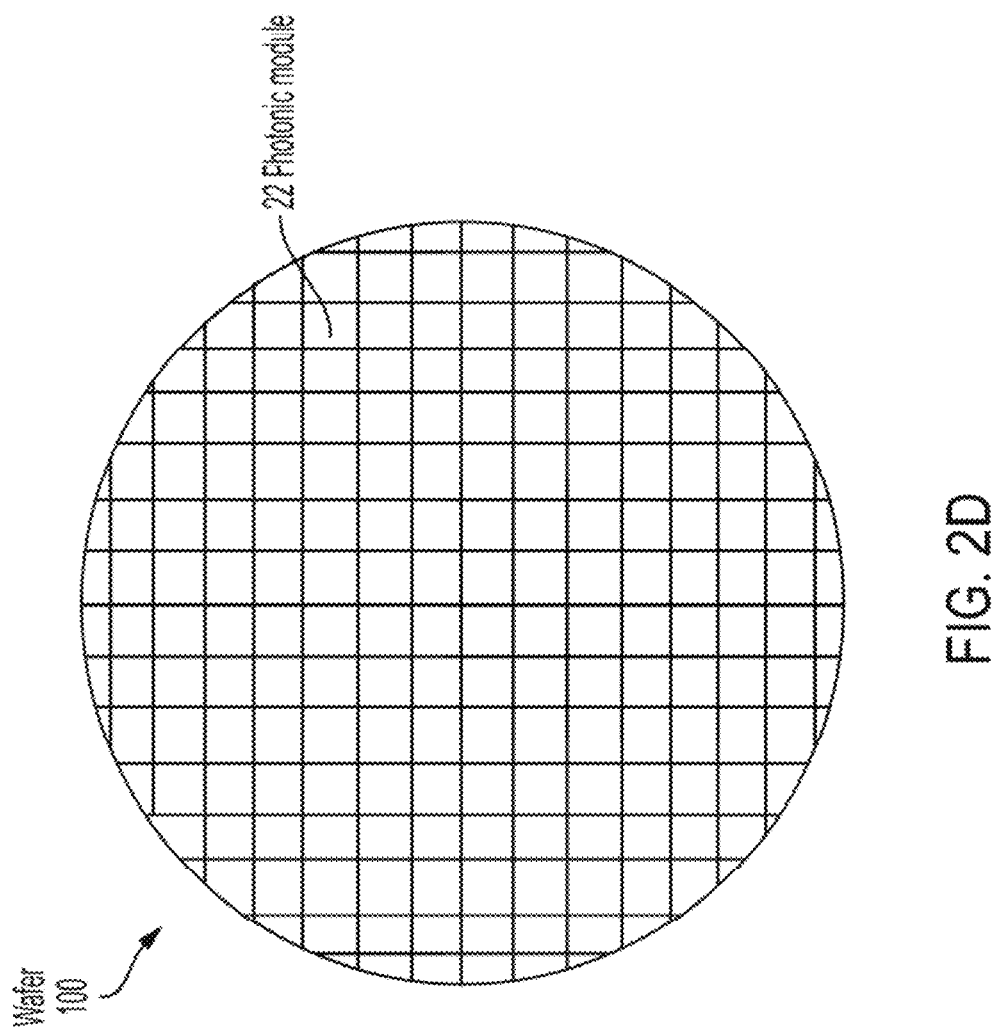
FIG. 2D illustrates the wafer of FIG. 2A patterned in accordance with the photomask set of FIG. 2B, in accordance with some embodiments.
Figure 2E:
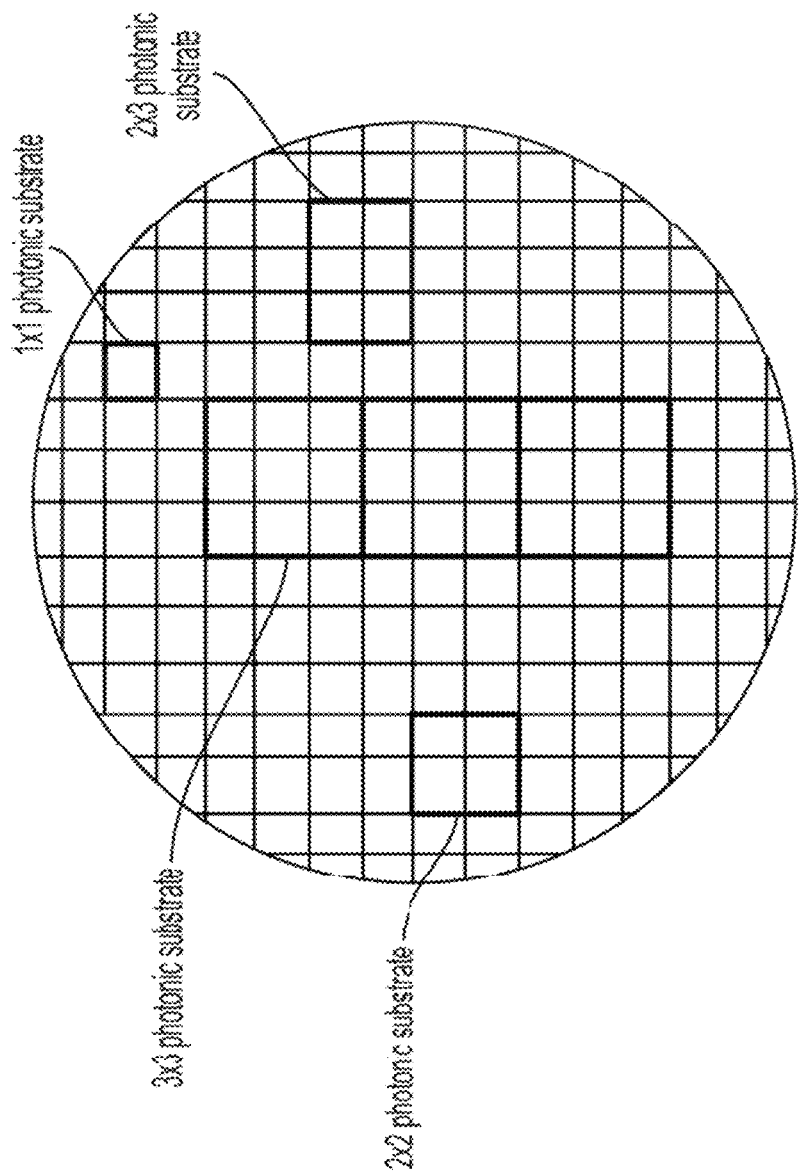
FIG. 2E identifies photonic substrates formed on the patterned wafer of FIG. 2D, in accordance with some embodiments.

In some embodiments, this process may be used to pattern wafer 100 with multiple copies of a template photonic module. In the example of FIG. 2D, wafer 100 has been patterned with a grid of photonic modules 22. The photonic modules may share the pattern of one or more photomasks of set 200. For example, the photonic modules may share the pattern of the same waveguide photomask(s) and/or the same m trace photomask(s). In other embodiments, the photonic modules share the pattern of all the photomasks of set 200. For example the photonic modules may share the same optical waveguide pattern, the same n-doping pattern, the same p-doping pattern, the same contact pattern, the same metal trace pattern, etc.

In some embodiments, the entire surface of wafer 100 is patterned using photomask set 200. However, not all embodiments are limited in this respect as some portions of wafer 100 may be patterned using a first photomask set and other portions of wafer 100 may be patterned using a second photomask set. In some embodiments, the first and second photomask sets may share one or more common photomasks, such as a waveguide photomask.

Once patterned, wafer 100 may include multiple photonic substrates. Photonic modules 22 may be separated from the wafer together to form photonic substrates of any desired shape and size. For example, the wafer of FIG. 2E has been marked to obtain six photonic substrates from wafer 100. This figure identifies a 1×1 photonic substrate having only one photonic module 22, a 2×2 photonic substrate having four photonic modules 22, a 2×3 photonic substrate having six photonic modules 22, and three 3×3 photonic substrates having nine photonic modules 22 each. Separation of a photonic substrate from the wafer involves dicing the wafer along the perimeter of the desired photonic substrate. One of the 3×3 photonic substrates of wafer 100 may be used as the photonic substrate of the example computing system of FIG. 1 (see photonic substrate 20).

The techniques described in connection with FIGS. 2A-2D enable manufacturing of photonic modules at relatively low costs. Some semiconductor foundries require that the same photomask set (or at least one photomask) be used for patterning the entirety of a wafer (or at least a portion of a wafer). Otherwise, patterning different portions of a wafer using different photomasks would involve replacing one photomask for another between photolithographic exposures, which would make the step-and-repeat process inefficient and costly. Designing photonic modules that share at least one photomask enables fabrication of many photonic modules on the same semiconductor wafer while leveraging standard, low-cost step-and-repeat processes.

Figure 3A:
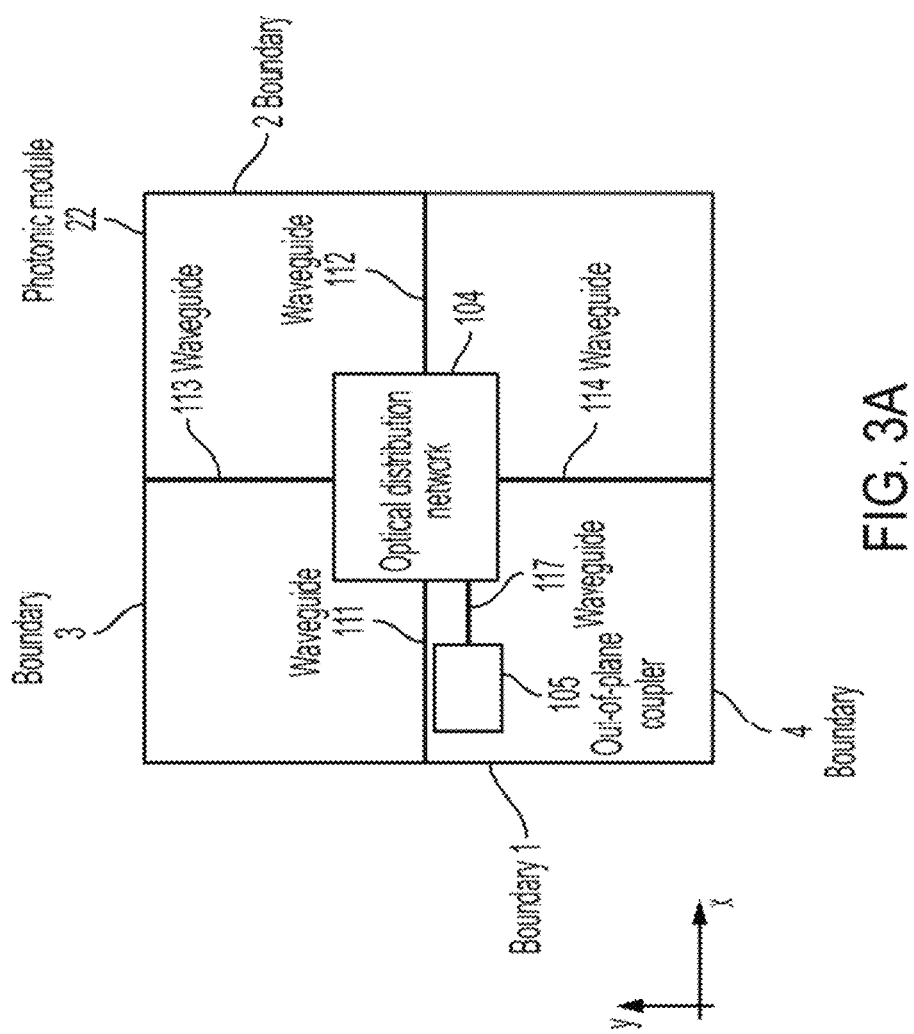
FIG. 3A illustrates an example photonic module of the patterned wafer of FIG. 2E, in accordance with some embodiments.

FIG. 3A illustrates an example photonic module 22. In this example, photonic module 22 is shaped as a rectangle (though other shapes are also possible, such as squares or other polygons). As such, photonic module 22 is bounded by four boundaries (boundaries 1, 2, 3 and 4). Boundary 1 is opposite to boundary 2, and boundary 3 is opposite to boundary 4. Boundary 1 is adjacent to boundaries 3 and 4, and boundary 2 is also adjacent to boundaries 3 and 4. Photonic module 22 includes an optical distribution network 104 coupled to waveguides 111, 112, 113 and 114. Waveguide 111 optically couples optical distribution network 104 to boundary 1. As such, optical signals coupled from optical distribution network 104 to waveguide 111 can be transferred outside the photonic module by crossing boundary 111. Similarly, waveguide 112 optically couples optical distribution network 104 to boundary 2, waveguide 113 optically couples optical distribution network 104 to boundary 3 and waveguide 114 optically couples optical distribution network 104 to boundary 4. In some embodiments, the boundaries of a photonic module are defined based on a photolithography shot (e.g., the boundaries are defined by the boundaries of the photomask(s) used to fabricate the photonic module). In other embodiments, however, one photolithography shot may define more than one photonic module. For example, a photomask may be patterned with multiple side-by-side instances of a template photonic module. In some such embodiments, the boundaries of a photonic module are defined where adjacent instances of the template photonic module meet.

While the example of FIG. 3A illustrates waveguides coupling the optical distribution network to each of the boundaries, not all embodiments are arranged in this manner In other embodiments, a photonic module 22 may include two of these four waveguides, such as waveguides 111 and 112, or waveguides 111 and 113. In yet other embodiments, a photonic module 22 may include three of these four waveguides, such as waveguides 111, 112 and 113. Optical distribution network 104 includes photonics components (e.g., photonic switches) for routing optical signals inside and outside photonic module 22.

In some embodiments, a photonic module may include multiple layers of photonic waveguides Similar to how multiple layers of conductive traces increase an electronic circuit's ability to route electric signals, multiple layers of waveguides increase a photonic module's ability to route optical signals. In one example, one layer includes silicon waveguides, and one layer includes silicon nitride waveguides. In another example, multiple layers include silicon waveguides. Additionally or alternatively, multiple layers include silicon nitride waveguides. The choice of material of each waveguide layer may be determined by the wavelength of light that will be routed by the waveguide. For example, silicon and silicon nitride layers may be used for routing infrared light in the telecommunication bands with wavelengths around 1.3 lam or 1.5 µm. In some examples, the multiple layers of waveguides may also include aluminum nitride waveguides that can be used to route visible light down to UV wavelengths or aluminum oxide waveguides that are used to route UV light. Each layer may be arranged in a configuration similar to that illustrated in FIG. 3A—with an optical distribution network that routes signals among the waveguides of the layer.

Photonic module 22 further includes one or more out-of-plane couplers 105. Waveguide 117 optically couples out-of-plane coupler 105 to optical distribution network 104. Out-of-plane coupler 105 is configured to emit light received from waveguide 117 outside the xy-plane, for example in a direction parallel to the z-axis or at an angle relative to the z-axis. Out-of-plane coupler 105 may be further configured to capture light shining from outside the xy-plane and to convey the captured light to waveguide 117. Out-of-plane coupler 105 enables optical communication between photonic module 22 and a die disposed above the photonic module and/or below the photonic module. Out-of-plane coupler 105 may be implemented using any suitable optical component, including for example optical gratings, lenses, and prisms. In some embodiments, the optical distribution network may be configured so that the same out-of-plane coupler enables optical communication in both directions—from optical distribution network 104 to a die and from the die to optical distribution network 104. In other embodiments, one out-of-plane coupler 105 may enable optical communication in one direction, and another out-of-plane coupler 105 (not shown in FIG. 3A) may enable optical communication in the opposite direction. In one embodiment, the out-of-plane coupler 105 may be used to couple light source into the optical distribution network 104. The light source can be one of lasers (continuous-wave or pulsed), LEDs, or superluminescent diodes.

Figure 3B:
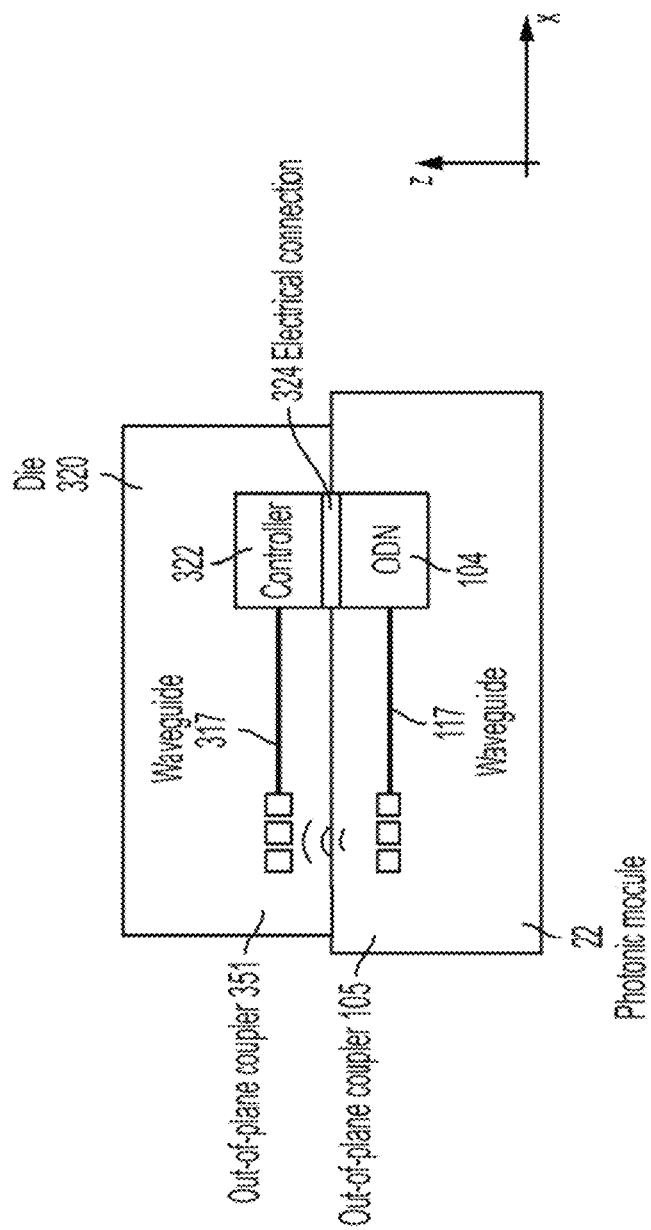
FIG. 3B illustrates optical out-of-plane coupling between a photonic module and a die, in accordance with some embodiments.

FIG. 3B illustrates how an out-of-plane coupler 105 may be used to enable out-of-plane optical communication. For clarity, only out-of-plane coupler 105, waveguide 117 and optical distribution network (ODN) 104 are illustrated inside optical module 22. In this example, out-of-plane coupler 105 is implemented with an optical grating. Die 320 is mounted to photonic module 22. Die 320 may include a processor, a memory, and/or other electronic components (not illustrated in FIG. 3B). Further, die 320 includes out-of-plane coupler 351, waveguide 317 and controller 322. Controller 322 is electrically coupled to optical distribution network 104 via electrical connection 324, which may include for example a ball-grid array, copper pillars, through silicon vias, microbumps, metals pads, etc. In this example, out-of-coupler 105 is emitting light in a direction parallel to the z-axis towards out-of-plane coupler 351. Out-of-plane coupler captures the light and conveys the captured light to controller 322 via waveguide 317.

Controller 322 controls the operations of optical distribution network 104. For example, controller 322 controls the state of the switches of optical distribution network 104. Control signals are provided to optical distribution network 104 via electrical connection 324. Alternatively, or additionally, a controller may be formed directly on photonic module 22, and this controller may control the operations of optical distribution network 104. This controller may provide control signals to optical distribution network 22 via conductive traces formed on photonic module 22.

Referring back to FIG. 3A, optical distribution network 104 may selectively couple any components of photonic module 22 to any other components of photonic module 22. For example, optical distribution network 104 may enable passage of light between waveguide 111 and waveguide 112, and/or between waveguide 111 and waveguide 113, and/or between waveguide 113 and waveguide 114, and/or between out-of-coupler 105 and waveguide 111, and/or between out-of-coupler 105 and waveguide 113, etc.

Figure 3C:
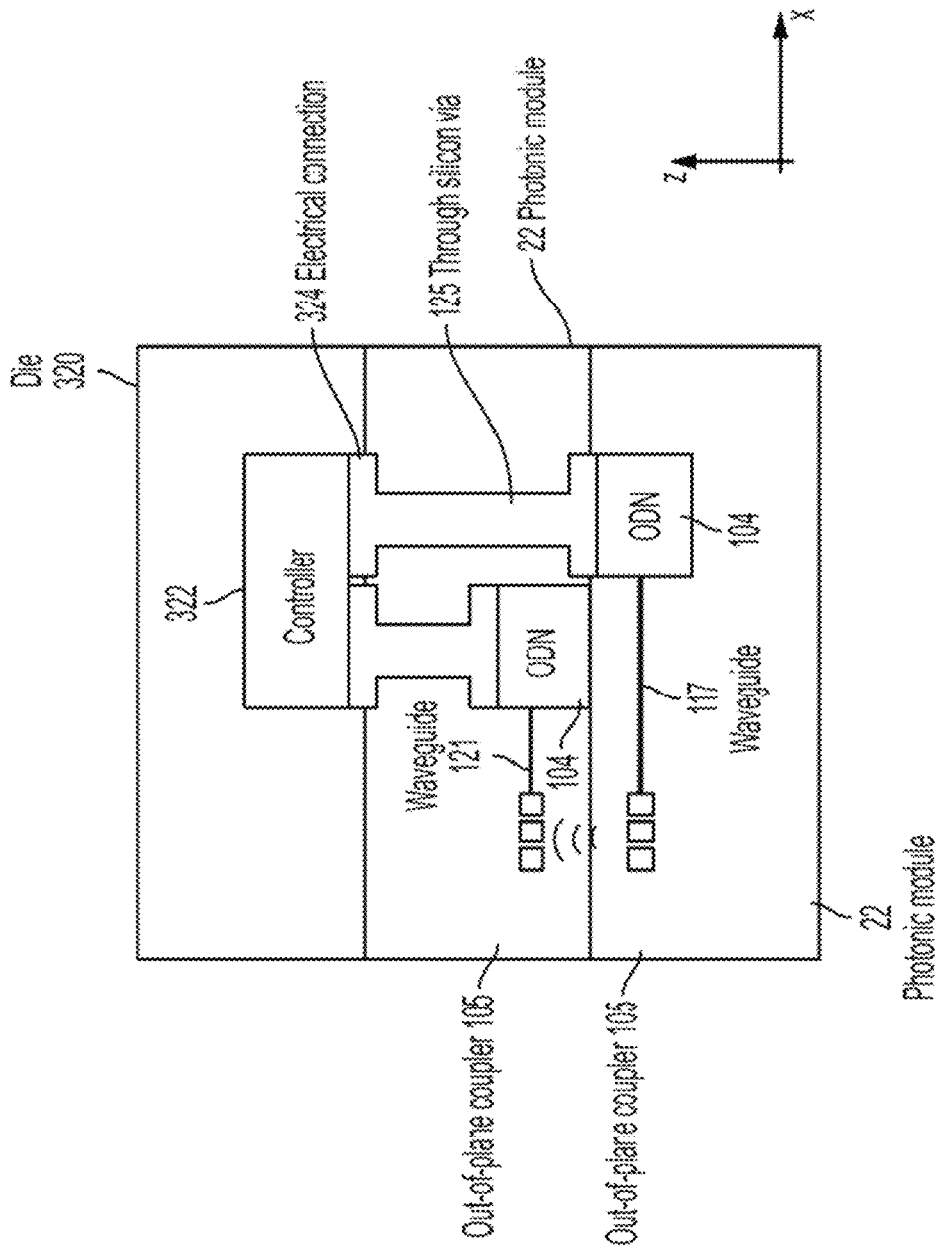
FIG. 3C illustrates optical out-of-plane coupling between photonic communication fabrics, in accordance with some embodiments.

FIG. 3C illustrates how an out-of-plane coupler 105 may be used to communicate between two photonic communication fabrics. For clarity, the figure only shows two photonic modules 22, one from each photonic communication fabric, optically coupled to one another using out-of-plane couplers 105. Controller 322 is electrically coupled to both optical distribution networks 104 using electrical connection 324 and the through-silicon-via 125. Having multiple photonic communication fabrics stacked one on top of another increases the number of optical and electronic communication channels between each site. Furthermore, having multiple communication fabrics may reduce the number of waveguide crossings needed to route optical signals across a photonic module, thus reducing optical loss and improving the overall power budget.

Figure 3D:
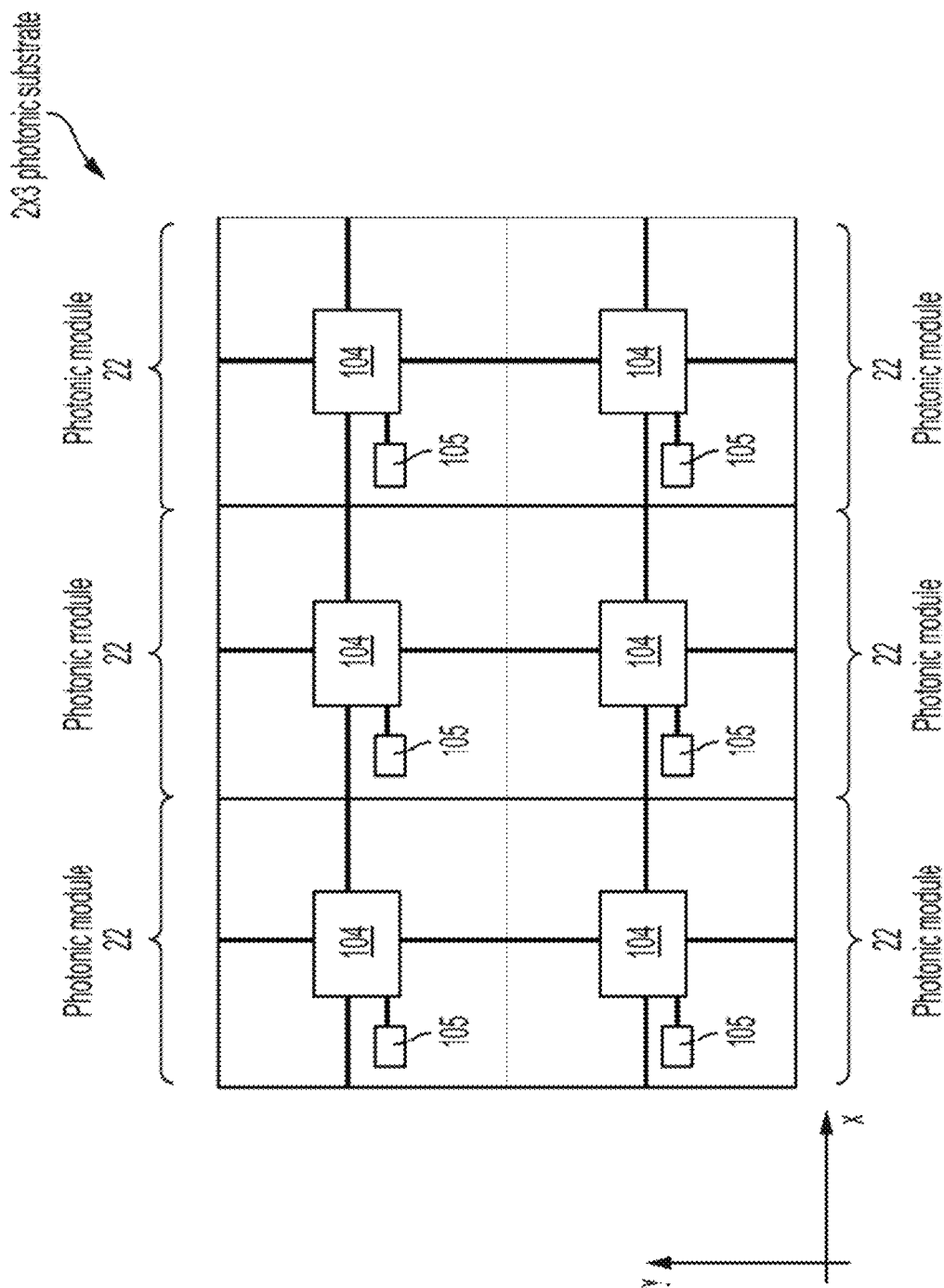
FIG. 3D illustrates a group of photonic modules of the type illustrated in FIG. 3A, in accordance with some embodiments.

A photonic substrate may include multiple photonic modules connected together to collectively form an optical network. FIG. 3D illustrates an example 2×3 photonic substrate including six photonic modules 22. This photonic substrate is obtained by dicing a group of 2×3 photonic modules off of wafer 100 (see FIG. 2E). The photonic modules 22 are arranged to that waveguide 111 of an optical module is aligned with waveguide 112 of the optical module to the left of that optical module, waveguide 112 of an optical module is aligned with waveguide 111 of the optical module to the right of that optical module, waveguide 113 of an optical module is aligned with waveguide 114 of the optical module above that optical module and waveguide 114 of an optical module is aligned with waveguide 113 of the optical module below that optical module. As a result, the optical modules form an optical network. Optical distribution networks 104 may route optical signals anywhere inside or outside the network. Suppose, for example, that a processor is mounted to the photonic module positioned at the north-west corner of the photonic substrate and that a memory is mounted to the photonic module positioned at the south-east corner of the photonic substrate. A read operation may involve reconfiguring the optical distribution networks to place the processor in optical communication with the memory. For example, an optical communication path may be formed that 1) couples the processor to the out-of-plane coupler of the photonic module to which the processor is mounted, 2) couples the out-of-plane coupler of that photonic module to waveguide 112 of the same photonic module, 3) couples waveguide 112 of that photonic module to waveguide 111 of the adjacent photonic module (mid-uppermost photonic module), 4) couples waveguide 112 of the mid-uppermost photonic module to waveguide 111 of the next adjacent photonic module (north-east corner of the photonic substrate), 5) couples waveguide 114 of the photonic module positioned at north-east corner to waveguide 113 of the photonic module to which the memory is mounted, and 6) couples waveguide 113 of the photonic module to which the memory is mounted to the out-of-plane coupler of the same photonic module.

Figure 3E:
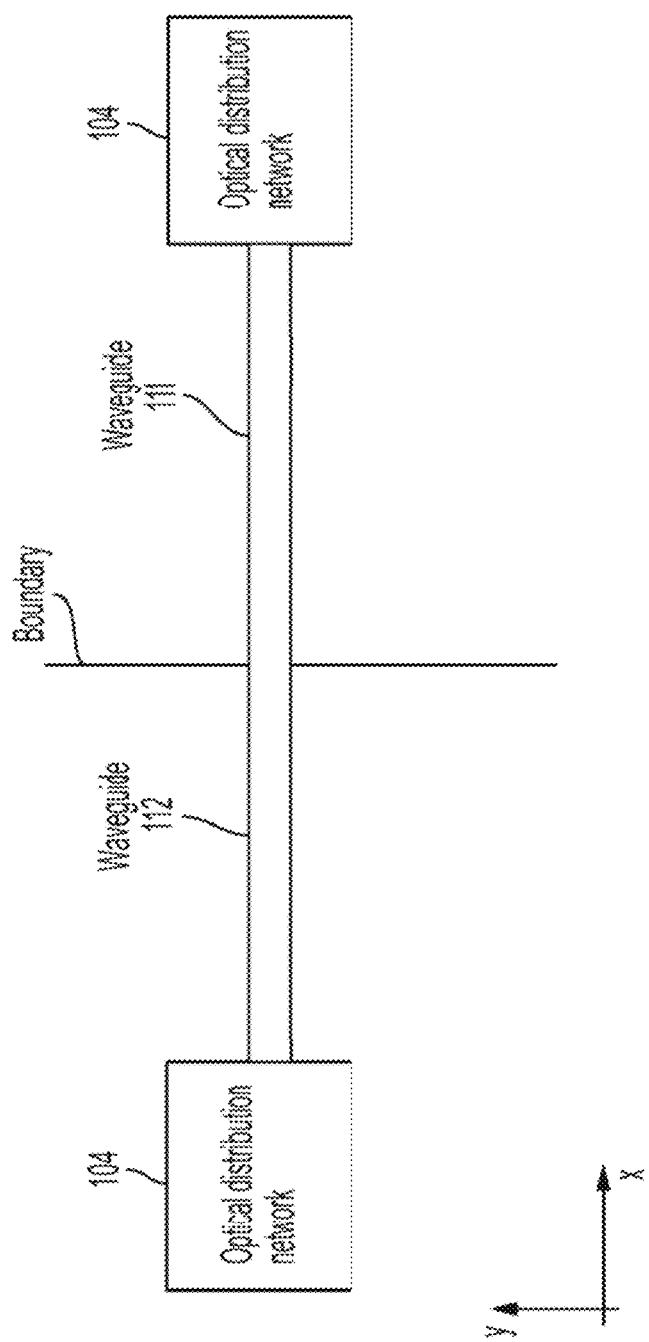
FIG. 3E illustrates a waveguide arrangement at the boundary between a pair of adjacent photonic modules, in accordance with some embodiments.

As discussed above, waveguides of adjacent photonic modules are optically coupled to one another, thereby permitting passage of light from one photonic module to the next. In some embodiments, the waveguides may be physically connected. This arrangement is illustrated in FIG. 3E, which depicts the region at the boundary of two adjacent photonic modules. As shown, waveguide 112 of the photonic module positioned on the left-hand side is physically connected to waveguide 111 of the photonic module positioned on the right-hand side. In some embodiments, a continuous waveguide crosses the boundary and extends between the respective optical distribution networks of the photonic modules.

Figure 3F:
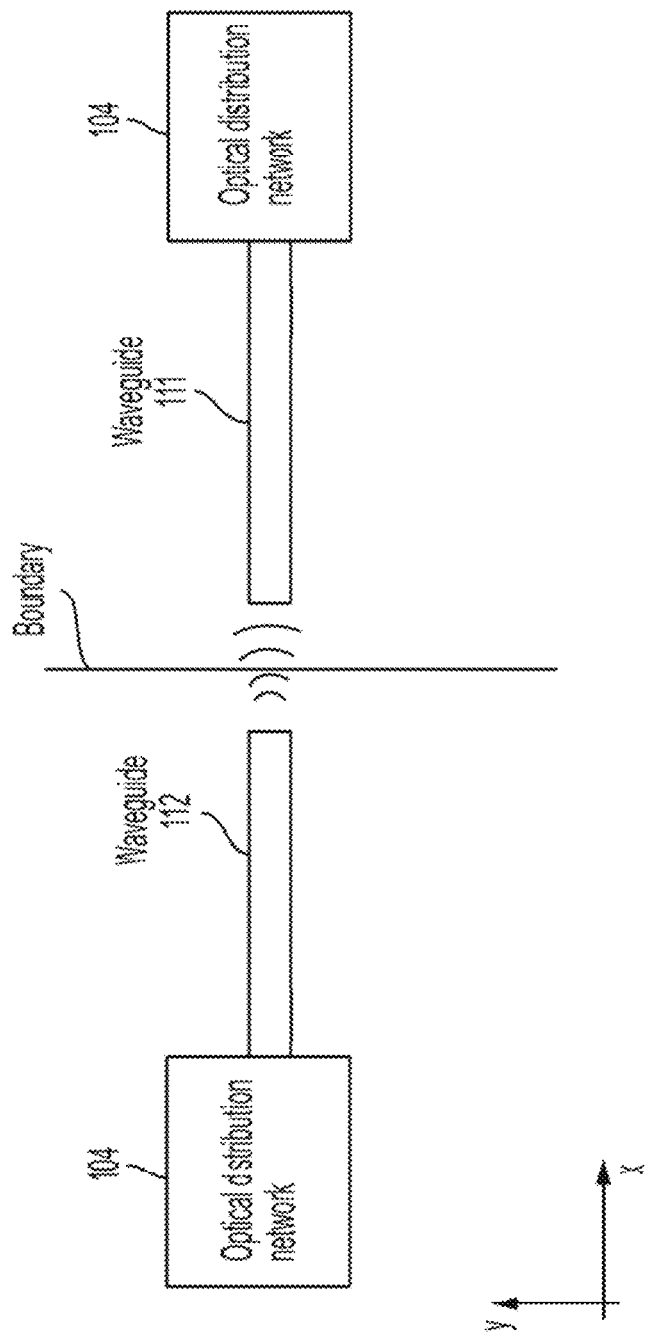
FIG. 3F illustrates another waveguide arrangement at the boundary between a pair of adjacent photonic modules, in accordance with some embodiments.

In other embodiments, there may be a gap between the waveguides. This arrangement is illustrated in FIG. 3F. In this example, each waveguide has an end that is located at a distance from the boundary. Thus, a gap is formed at the boundary region. Notwithstanding the gap, waveguides 111 and 112 are still optically coupled to each other. In this case, in fact, light emitted at the end of a waveguide reaches the end of the other waveguide by free space propagation. If the size of the gap is sufficiently small (e.g., less than 500 µm), most of the optical power radiated by one waveguide couples to the other waveguide.

Figure 3G:
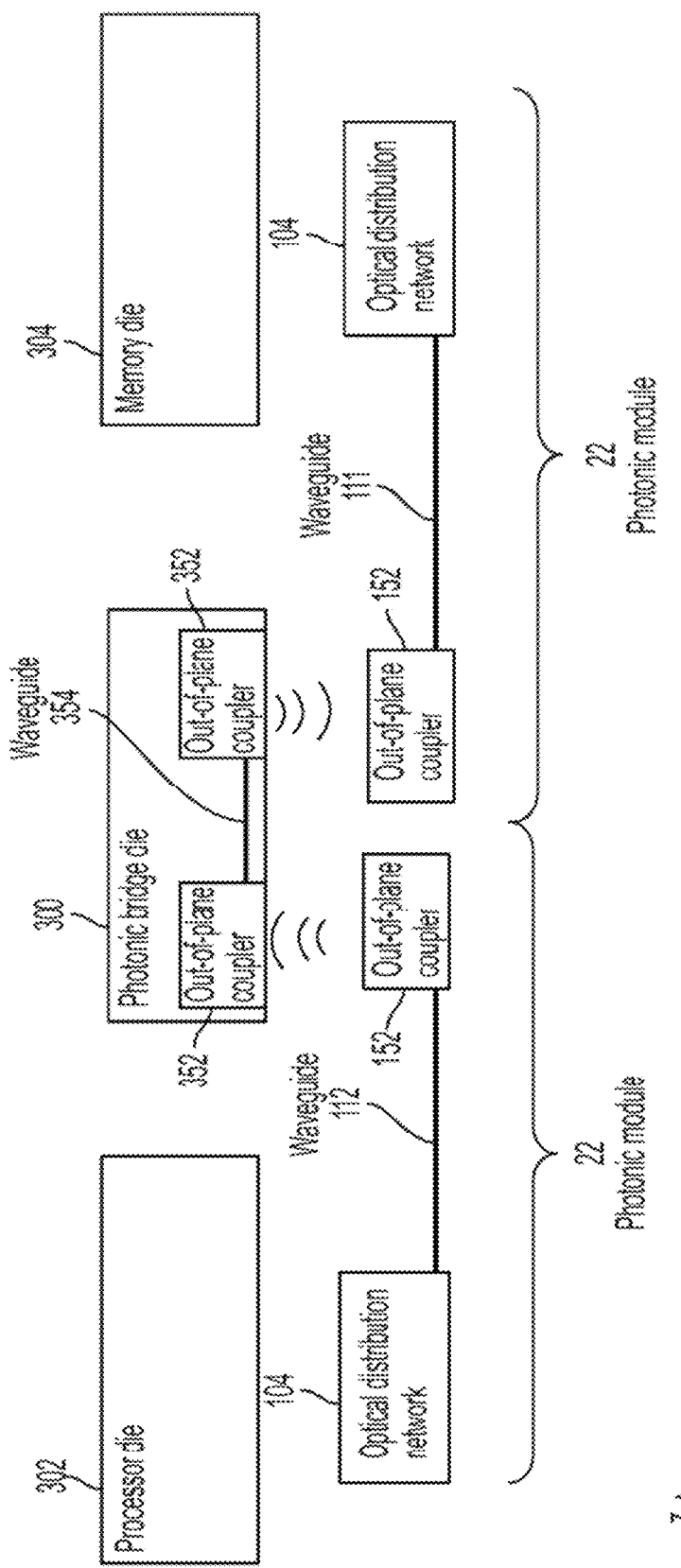
FIG. 3G illustrates another waveguide arrangement at the boundary between a pair of adjacent photonic modules, in accordance with some embodiments.

In yet other embodiments, as illustrated in FIG. 3G, a photonic bridge may be used to optically couple the waveguides to each other. In this example, the ends of the waveguides are coupled to respective out-of-plane couplers 152. A photonic bridge die 300 is mounted to the boundary region. Photonic bridge die 300 includes a pair of out-of-plane couplers 352 and an optical waveguide 354 that couples the out-of-plane couplers to one another. Suppose that a processor die 302 needs to send a read-out message to a memory die 304. This can be accomplished by 1) conveying light, out-of-plane, from processor die 302 to the respective photonic module (for example in the manner illustrated in FIG. 3B), 2) conveying light to waveguide 112, and consequently, to out-of-coupler 152, 3) conveying light to out-of-coupler 352, 4) conveying light to waveguide 354, and consequently, to the other out-of-coupler 352, 5) conveying light to the other out-of-coupler 152, and 6) conveying light, out-of-plane, from that photonic module to the memory die 304 (for example in the manner illustrated in FIG. 3B).

In some embodiments, photonic modules 22 may be patterned according to a common metal trace photomask. As a result, the photonic modules share the same pattern of metal traces. In some embodiments, photonic modules 22 are patterned according to multiple common photomasks. As a result, multiple levels of metal traces share the same patterns across different photonic modules. Some of the metal traces may be used to deliver power across a photonic substrate. Some of the metal traces may be used to deliver electronic signals across a photonic substrate.

Figure 3H:
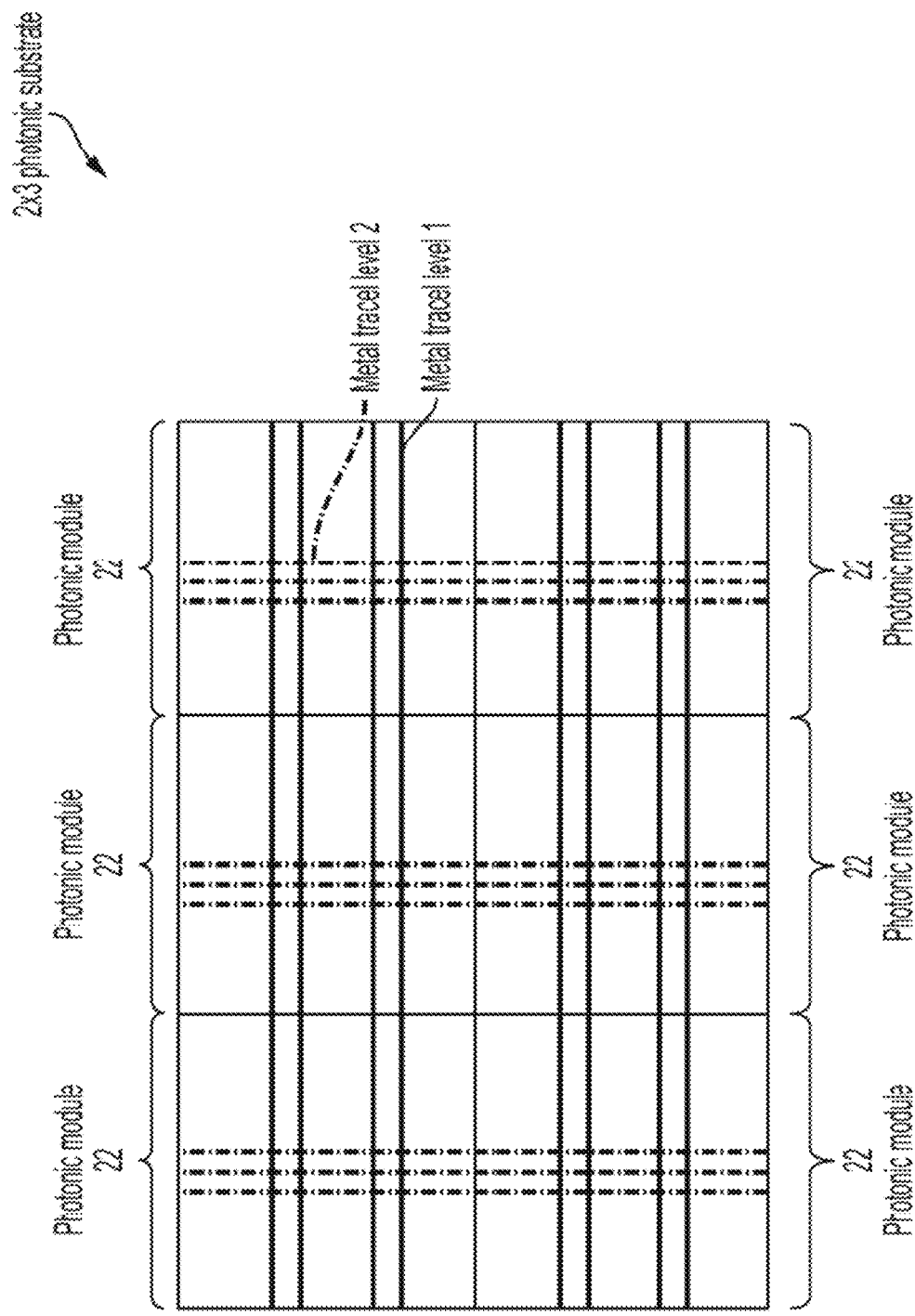
FIG. 3H illustrates a group of photonic modules sharing the same pattern of metal traces, in accordance with some embodiments.

FIG. 3H illustrates a 2×3 photonic substrate, in which each photonic module 22 shares the same pattern of metal traces. For the sake of illustration, only the metal traces are shown in this figure, though each photonic module further includes waveguides, one or more out-of-plane couplers and optical distribution networks, for example in the arrangement shown in FIG. 3D. In this example, there are two levels of metal traces. The metal traces of each level has been fabricated using the same photomask across the different photonic modules. The metal traces of metal trace level 1 run in the horizontal direction, thereby electrically coupling photonic modules that are adjacent to one another in the horizontal direction. The metal traces of metal trace level 2 run in the vertical direction, thereby electrically coupling photonic modules that are adjacent to one another in the vertical direction. Of course, other arrangements are also possible. For example, in other embodiments, the metal traces of the same level may electrically couple one photonic module to all the photonic modules that are adjacent to it.

The metal traces are arranged to carry electricity (e.g., signals and/or power) across the boundaries of the photonic modules. This may be achieved by patterning metal traces to be continuous across the boundaries of the photonic modules. In this example, the metal traces of level 1 are continuous across the vertical boundaries, and the metal traces of level 2 are continuous across the horizontal boundaries. Metal traces of different levels may be connected to one another using vias (not shown in FIG. 3H). In some embodiments, the photonic modules may share the same patterns of vias. In other words, the same via photomask may be used for each photonic module. In some embodiments, the photonic modules may have more (tens to hundreds of) metal traces. Some of these metal traces may be arranged to be continuous across photonic modules but, in some embodiments, a majority of the metal traces need not be patterned to be continuous across modules.

Metal traces may be used to deliver power and/or electric signals across the photonic substrate. In one example, a power source is connected to one particular photonic module. Power produced by the power source may be delivered from that particular photonic module to the other photonic modules using the metal traces. In another example, a controller chip may be bonded (e.g., 3D-bonded) to a particular photonic module. Control signals produced by the controller may be delivered from that particular photonic module to the other photonic modules using the metal traces. The control signals may control the states of the optical distribution networks of the photonic modules.

As discussed above, electronic control circuits may be used to control the operations of the photonic modules. These electronic control circuits may control, for example, how optical distribution networks 104 route optical signals. The electronic control circuits may be co-integrated with the photonic modules in various ways. In some embodiments, a photonic module may be formed on a first substrate and an electronic control circuit may be formed on a second substrate. The two substrates may bonded together to place the electronic control circuit in electrical communication with the optical distribution networks. In other embodiments, however, an electronic control circuit may be fabricated directly on the same substrate as a photonic module. Manufacturing photonic modules and electronic control circuit on the same substrate may reduce costs because, instead of having to rely on two separate fabrication processes and one bonding process, only one manufacturing process may be needed.

Figure 3I:
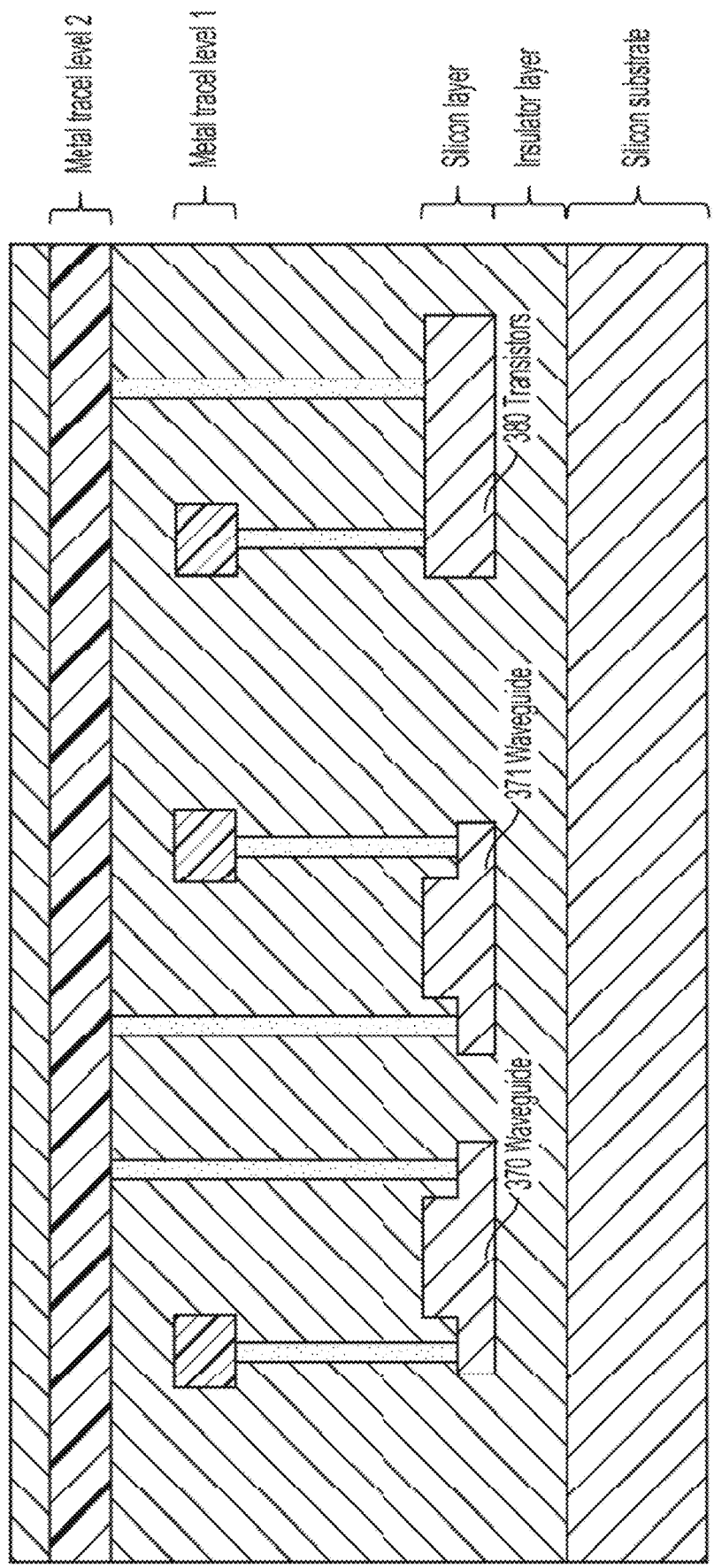
FIG. 3I illustrates a cross section of a photonic substrate, in accordance with some embodiments.

FIG. 3I is a cross section of a photonic substrate that co-integrates a photonic module with transistors. The transistors may be connected to one another to define an electronic control circuit. In this example, the photonic substrate is formed on an SOI substrate, though other types of substrates are also possible, including bulk silicon substrates. An insulator layer (e.g., a silicon dioxide layer) is formed on the silicon substrate. A silicon layer is formed on the insulator layer. The silicon layer is patterned to form waveguides and other optical components, such as the components described in connection with FIG. 3A. This cross section illustrates a portion of a Mach-Zehnder interferometer having arms defined by waveguides 370 and 371. This Mach-Zehnder interferometer defines one of the switches of an optical distribution network 104. Transistor block 380 is formed in the same silicon layer as waveguides 370 and 371. Transistor block 380 includes several transistors (e.g., several tens of thousands, several hundreds of thousands, several millions, or more) connected together to form an electronic control circuit. The photonic substrate further includes several levels of metal traces (although this examples shows only two levels of metal traces). Vias connect the metal traces to the waveguides and the transistors. The metal traces enable the electronic control circuit to control the operations of the Mach-Zehnder interferometer.

Figure 4:
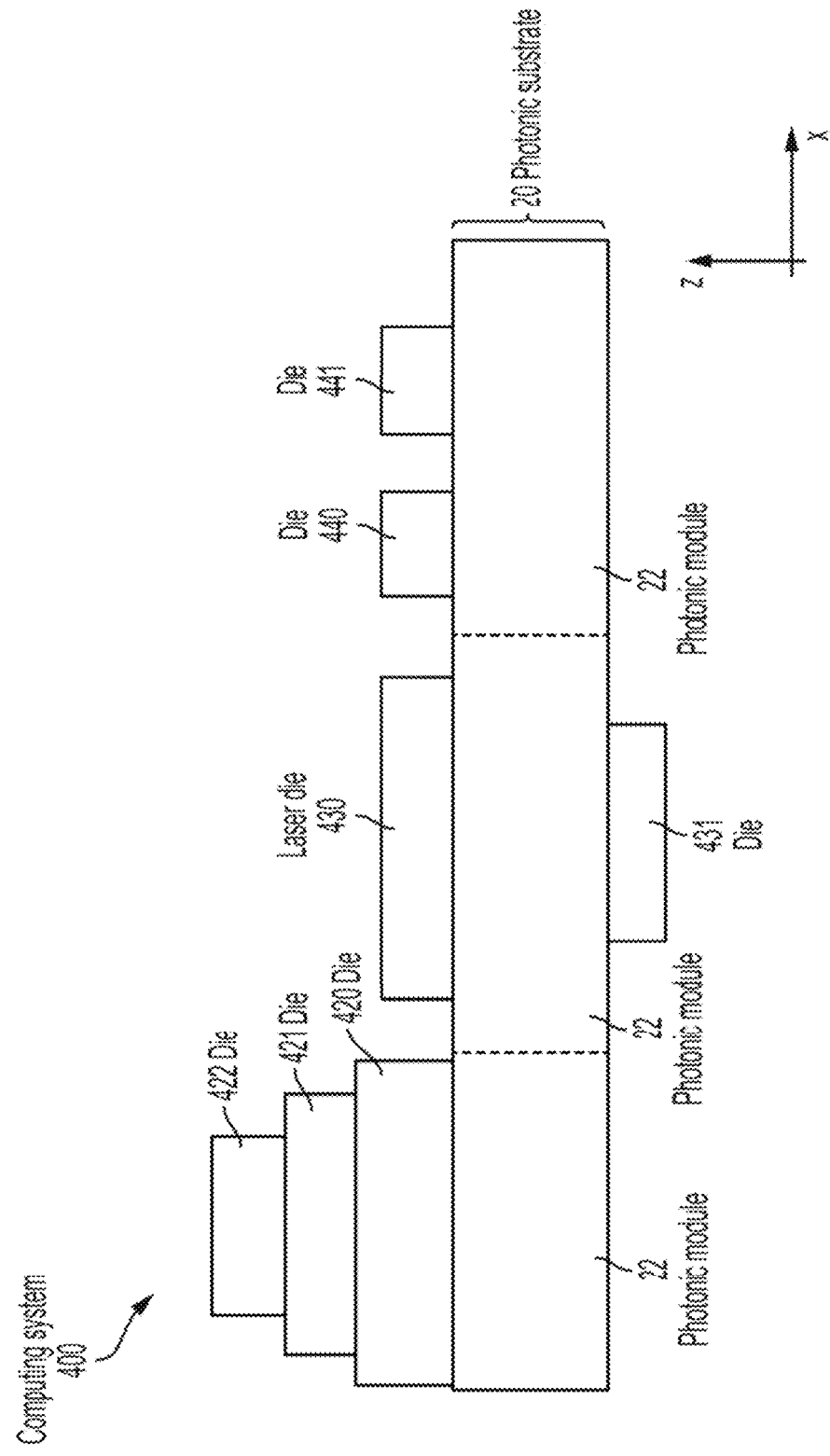
FIG. 4 illustrates a photonic system including dies mounted to a photonic substrate, in accordance with some embodiments.

FIG. 4 is a cross sectional view of an example computing system 400 based on a photonic substrate 20 (e.g., a 3×3 photonic substrate). A die stack including dies 420, 421 and 422 is mounted to the photonic module positioned at the left-hand side of photonic substrate 20. These dies may form, for example, a stacked memory unit. Laser die 430 is mounted to one side of the photonic module in the middle of the substrate, and die 431 is mounted to the opposite side of the same photonic module. To support dies on opposite sides, a photonic module may include at least one out-of-plane coupler that emits light in the upward direction and at least one out-of-plane coupler that emits light in the downward direction. Dies 440 and 441 are mounted, side-by-side, to the same photonic module. Dies 440 and 441 may include, for example, processors or memories. As described in connection with FIG. 3D, the photonic modules provide a platform for distributing optical signals from one die to another.

Laser die 430 includes one or more lasers. Light produced by the laser(s) can be distributed across the computing system and can serve as reference light to be modulated with data. Laser die 430 can include III-V lasers, such as InP-based lasers. Laser die 430 can be bonded to the photonic substrate, for example using surface mounting techniques. The laser(s) of laser die 430 can be coupled to the semiconductor substrate using out-of-plane couplers. In some embodiments, laser light which is emitted in a direction parallel to the chip surface can be directed towards the out-of-plane couplers using ball lenses.

Recent progress in die-to-wafer bonding of III-V lasers onto a silicon photonics-based wafer shows that the yield of the process may be well below 100%. To circumvent this problem, two or more lasers can be directed towards the same input of the photonic substrate. Only one laser may be used at a time, but if one laser fails, then another laser can be turned on and fed into the photonic substrate. Having multiple lasers per photonic substrate improves the reliability of the platform in case one or more lasers fail.

Chip-based III-V lasers are not the only external light source option for the optical communication platform. Other lasers (e.g., semiconductor-based such as those used in optical telecommunication) can be coupled into the platform using optical fibers or using free-space optics such as lenses. In some embodiments, 1-to-N splitters can be used to enable a single laser to provide light to multiple photonic modules, thus reducing the numbers of laser dies.

Some applications may require multiple lasers and may further require that optical signals emitted by the lasers be mutually coherent (e.g., temporally coherent). In some such embodiments, optical communication platforms of the types described herein can be used to lock the phase of one or more lasers to a single master laser. One or more optical distribution networks 105 may be configured to that the master laser is mixed with one of the slave lasers, and their beat interference pattern is measured. The beat interference pattern is used as an error signal to lock the phases, so that the entire system is coherent.

Lasers emitting at different wavelengths may be used in some embodiments to support wavelength multiplexing schemes. For example, wave-division-multiplexing (WDM)

schemes can be used to increase bandwidth utilization per waveguide. Other schemes include multi-mode waveguides, time-division multiplexing and/or polarization diversity. These techniques support multiple independent communication channels using the same optical path.

In some embodiments, appropriate light sources other than lasers such as LEDs or superluminescent diodes may be used in lieu of the aforementioned laser. The choice of the light source is also motivated by the choice of wavelength in the photonic communication fabric. If the fabric is intended to communicate using visible light, then the light sources should be selected to output the appropriate wavelengths of light.

IV. Optical Distribution Networks

Optical distribution network 104 may be implemented using optical switches. Examples of optical switches include Mach-Zehnder interferometers, optical resonators, multi-mode interference (MMI) waveguides, arrayed waveguide gratings (AWG), thermos-optic switches, acousto-optic switches, magneto-optic switches, MEMS optical switches, non-linear optical switches, liquid crystal switches, piezo-electric beam steering switches, grating switches, dispersive switches, etc.

Optical distribution networks 104 may be static or dynamic (e.g., reconfigurable based on electrical or optical control signals). A static network may for example receive multiple wavelengths from the same input waveguide and route each wavelength to a different output waveguide. Another static network may receive two orthogonal polarizations from the same input waveguide and route each polarization to a different output waveguide. Another static network may receive multiple modes from the same input multimode waveguide and route each mode to a different output waveguide.

Figure 5A:
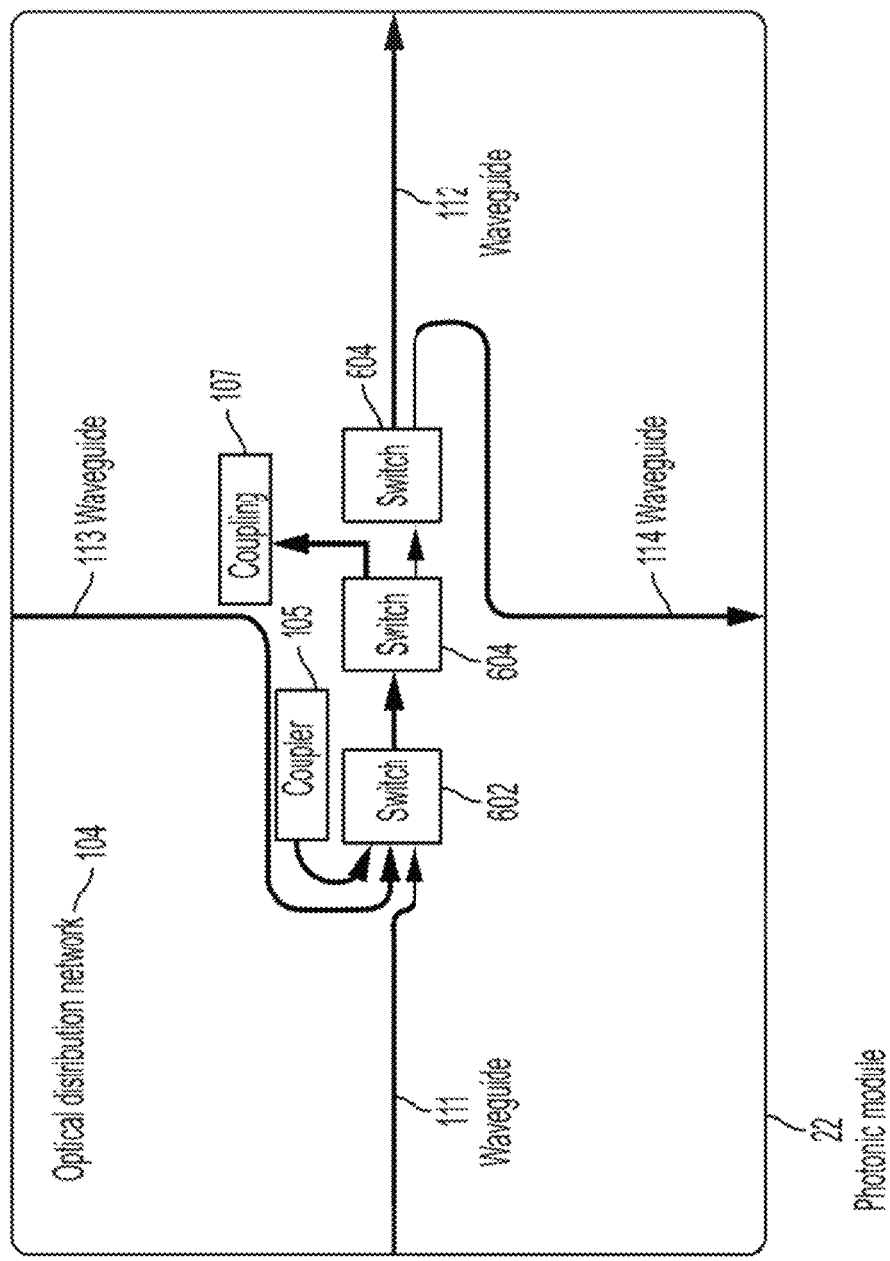
FIG. 5A illustrates an example optical distribution network, in accordance with some embodiments.

Dynamic optical distribution networks may be reconfigured depending upon the needs of a computing system. FIG. 5A illustrates an example of a dynamic optical distribution network. In this example, optical distribution network 104 includes a 3×1 switch 602, two 1×2 switches 606 and an optical coupling element 107. This photonic module further includes waveguides 111-114 and out-of-plane coupler 105, which may enable optical communication with a laser die or other dies. Switch 602 selects as input one among waveguide 111, waveguide 113 and out-of-plane coupler 105. The first switch 604 routes the input received from switch 602 to either optical coupling element 107 or switch 604. Optical coupling element 107 directs the light power to the photonic transmitters illustrated in FIG. 6. In some embodiments, optical coupling element 107 includes an out-of-plane coupler for coupling light to a die. The second switch 604 routes the input received from the first switch 604 to either waveguide 112 or waveguide 114. In some embodiments, switches 604 are implemented using Mach-Zehnder interferometers.

Figure 5B:
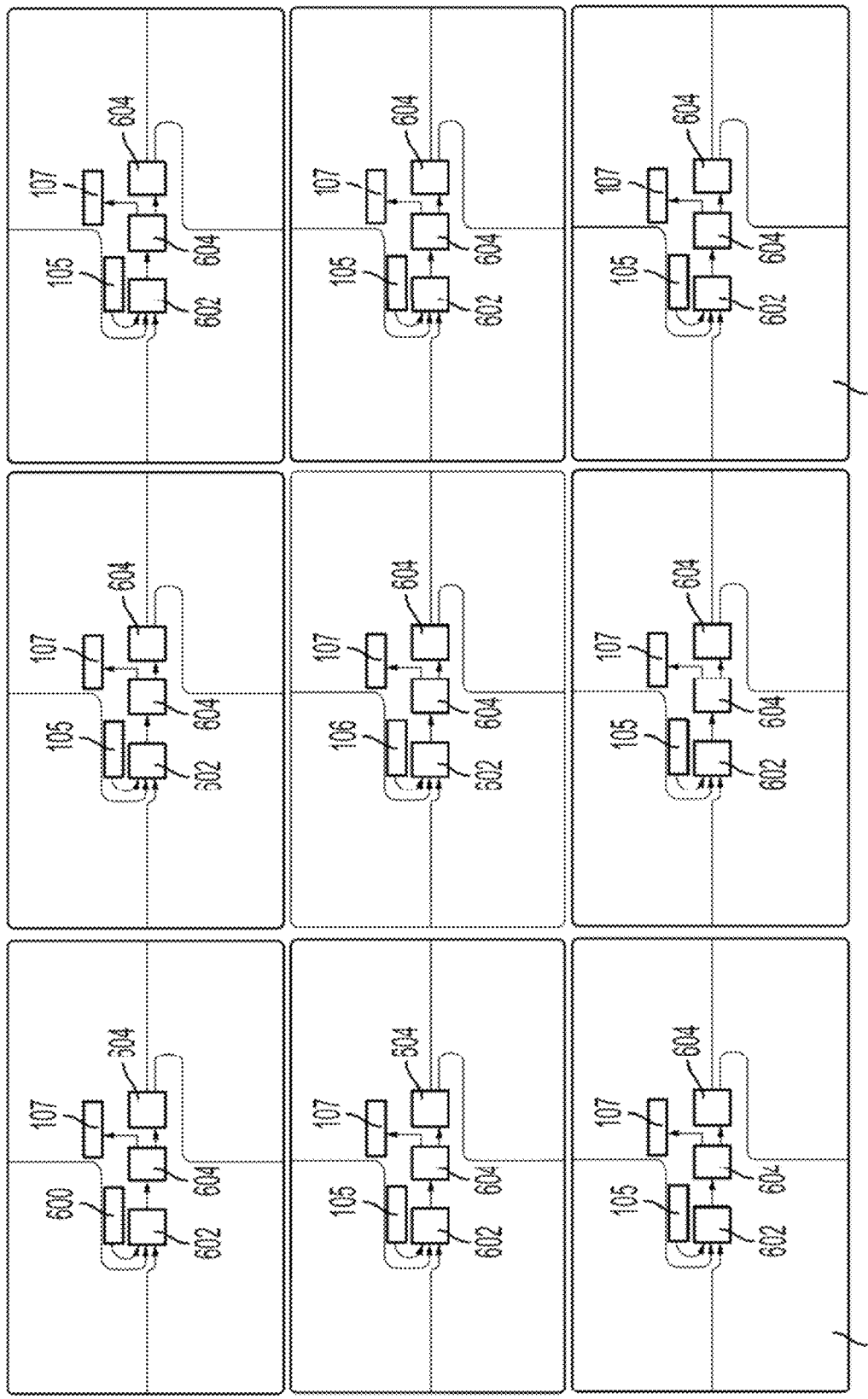
FIG. 5B illustrates a plurality of photonic modules each including the optical distribution network of FIG. 5A, in accordance with some embodiments.

FIG. 5B illustrates a 3×3 photonic substrate including photonic modules of the type illustrated in FIG. 5A. In this example, the photonic chip positioned at the north-west corner of the photonic substrate is coupled to a laser 600. In some embodiments, laser 600 is formed on a laser die and is optically coupled to out-of-plane coupler 105. In other embodiments, laser 600 is integrated as part of that photonic module (for example, is placed in a trench formed through the top surface of the photonic module). Laser 600 may emit a single wavelength or multiple wavelengths. In some embodiments, laser 600 provides light to the entire photonic substrate, though in other embodiments, other photonic modules may also have lasers.

Figure 5C:
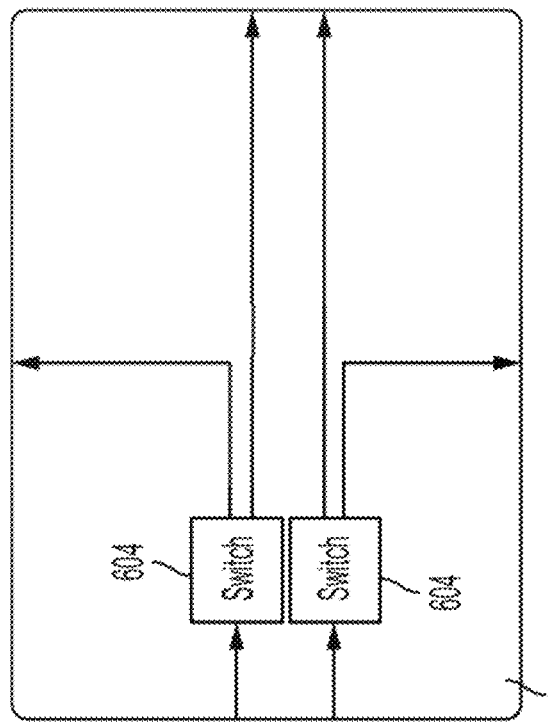
FIG. 5C illustrates another example optical distribution network, in accordance with some embodiments.
Figure 5D:
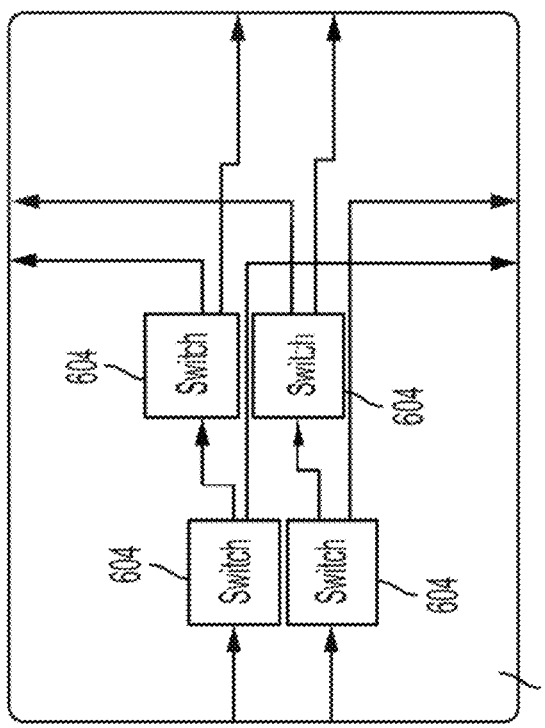
FIG. 5D illustrates another example optical distribution network, in accordance with some embodiments.

FIGS. 5C and 5D illustrate other possible implementations for an optical distribution network 104. The example of FIG. 5C is fully-connected—all boundaries of the photonic module are mutually coupled. Light incoming from a boundary passes through multiple 1×2 switches 604, which determine whether light proceeds straight, to the left or to the right. In some embodiments, routing may be performed for each optical channel (e.g., each waveguide mode, polarization or wavelength).

A fully connected routing topology, however, may not be necessary or feasible in some embodiments. To reduce the complexity of the optical distribution network, routing may be restricted to fewer options, as shown in the example of FIG. 5D (which includes two 1×2 switches). Reducing the routing options allows for a lower number of switches per optical module, thereby lowering power consumption and channel crosstalk, and improving signal-to-noise ratio (SNR). These gains, however, are made at the expenses of data bandwidth.

V. Optical Interconnect Fabric

Figure 6A:
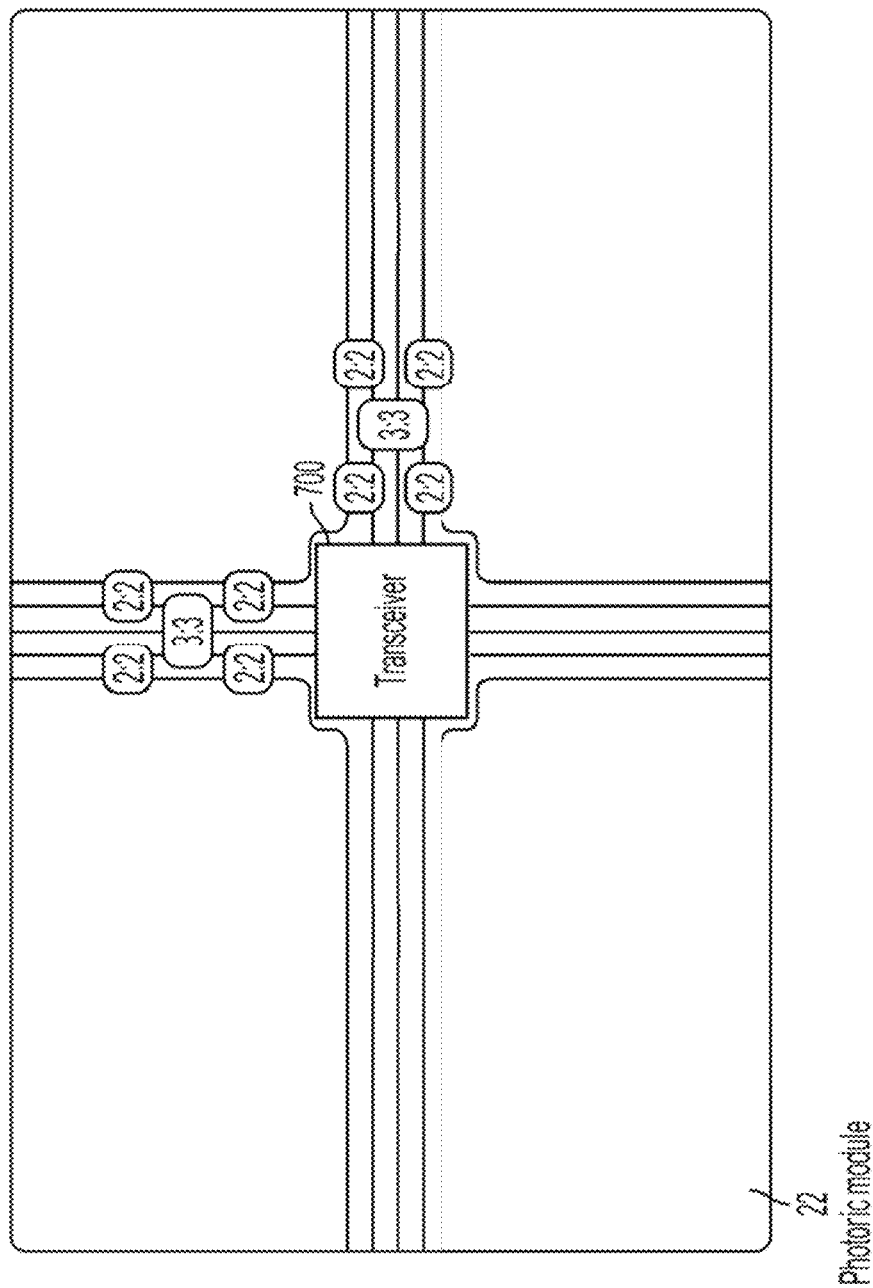
FIG. 6A illustrates a photonic module including a transceiver and a plurality of switches, in accordance with some embodiments.
Figure 6B:
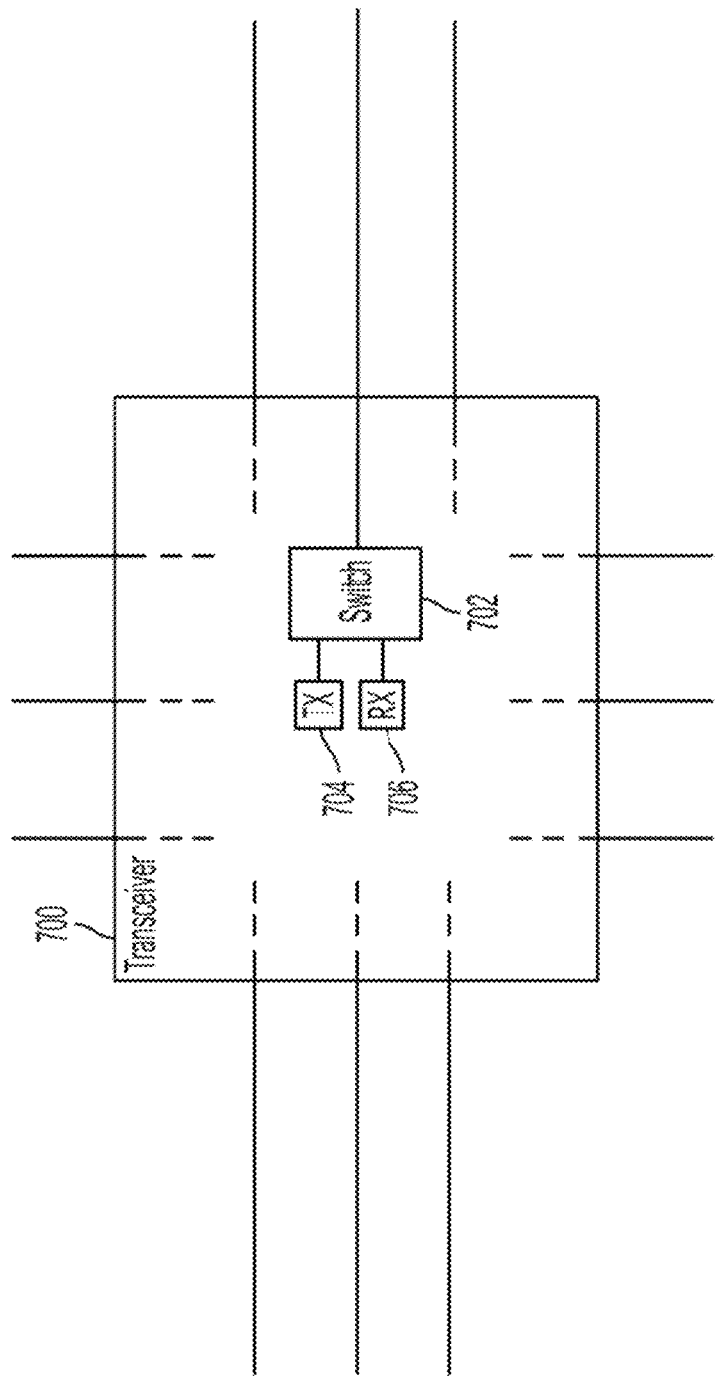
FIG. 6B illustrates the transceiver of FIG. 6A in additional detail, in accordance with some embodiments.
Figure 6C:
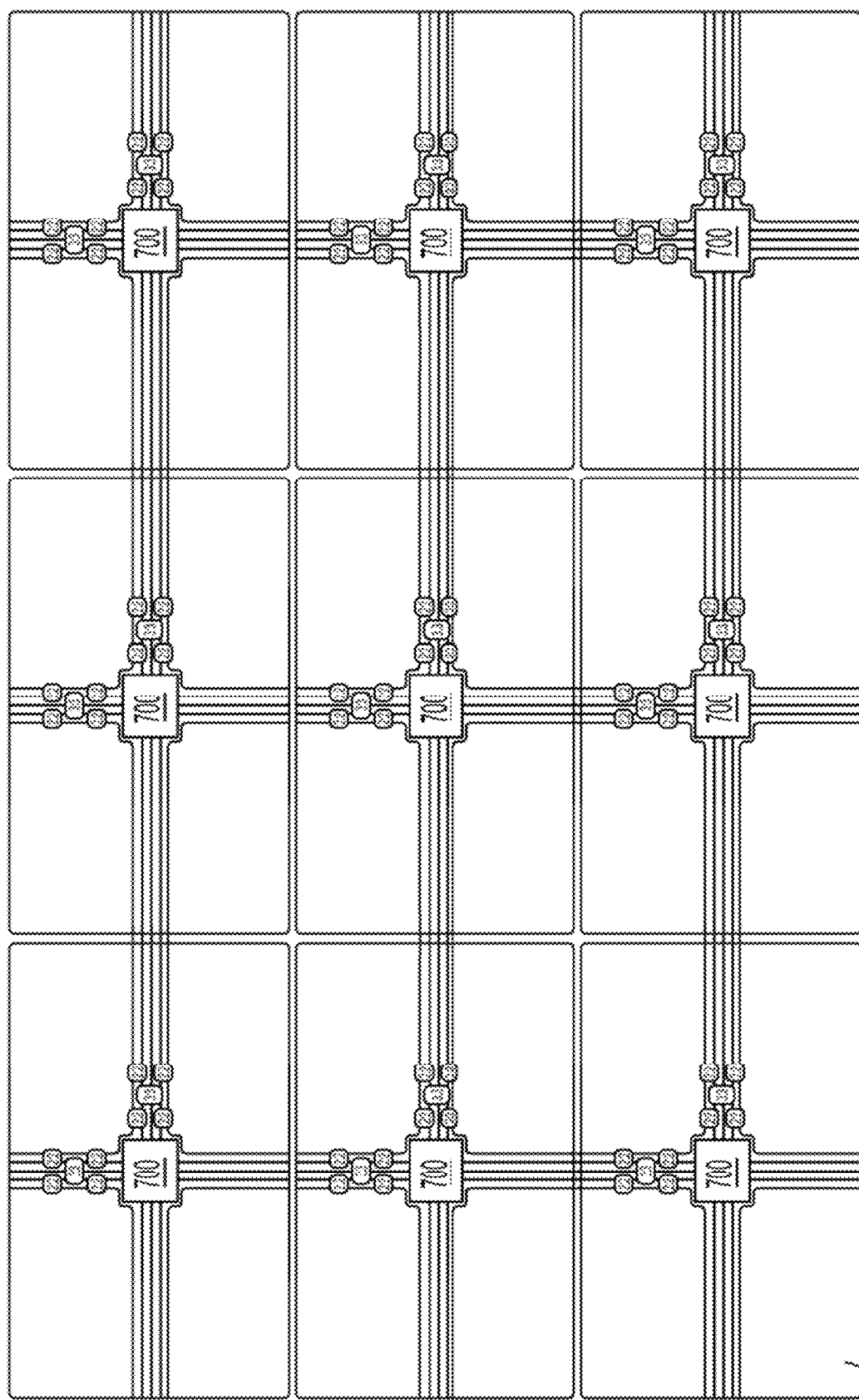
FIG. 6C illustrates a plurality of photonic modules of the type illustrated in FIG. 6A, in accordance with some embodiments.

FIG. 6A illustrates an example of a reconfigurable photonic communication fabric. This communication fabric includes several switches, where "2:2" indicates a 2×2 switch and "3:3" indicates a 3×3 switch. The switches may be configured depending upon the needs of a computing system. Transceiver 700 includes optical-to-electrical converters and electrical-to-optical converters. In some embodiments, transceiver 700 embodies optical coupling element 107 of FIG. 5A. FIG. 6B illustrates an example of a transceiver 700. For clarity, only one transmitter/receiver pair is shown, though there may be a transmitter/receiver pair for each waveguide coupled to transceiver 700. Switch 702 arbitrates between a transmitter (TX) 704 and a receiver (RX) 706. TX 704 includes an electrical-to-optical converter, such as an optical modulator. RX 706 includes an optical-to-electrical, such as an optical receiver. FIG. 6C illustrates a 3×3 photonic substrate, where each node includes the photonic module of FIG. 6A.

VI. Electronic Switching Network

The inventors have appreciated that interfacing dies (e.g., memories, processors, etc.) with the photonic substrates described herein raises compatibility issues. Ideally, dies are predefined with control circuits for controlling the operations of the optical distribution networks and pins that align perfectly with the pins of the photonic substrate. In this way, the die and the photonic substrate are inherently predisposed to communicate with each other once they are bonded together. This approach, however, may be impractical because the die and the photonic substrate are often manufactured by different entities. For example, one entity in the United States may manufacture the photonic substrate and another entity in Japan may manufacture a die. This approach puts the burden on the entity that manufactures the die to include control circuits and pins that are compatible with the photonic substrate, which can substantially increase costs for the die manufacturer. Recognizing this problem, the inventors have developed electronic switching networks that serve as interfaces between photonic substrates and dies. These electronic switching networks are arranged so that dies need not be redesigned to be compatible with a photonic substrate, thus saving costs to die manufacturers. In essence, an electronic switching network defines the switching and control protocols for a photonic communication platform.

Some electronic switching networks are co-fabricated with the photonic modules. In some embodiments, an electronic switching network is formed on the same substrate on which the photonic modules are formed. Referring back to FIG. 3I, for example, an electronic switching network may be defined by transistors 380. In other embodiments, the photonic modules are formed on a first substrate, an electronic switching network is formed on a second substrate, and the substrates are bonded (e.g., 3D-bonded) together. Regardless of how it is formed, an electronic switching network may be used to program the optical distribution networks 104. Use of electronic switching networks enables design of dies with minimal interface circuitry, thus reducing the costs that die manufacturers have to incur to make their dies compatible with a photonic substrate.

Figure 7A:
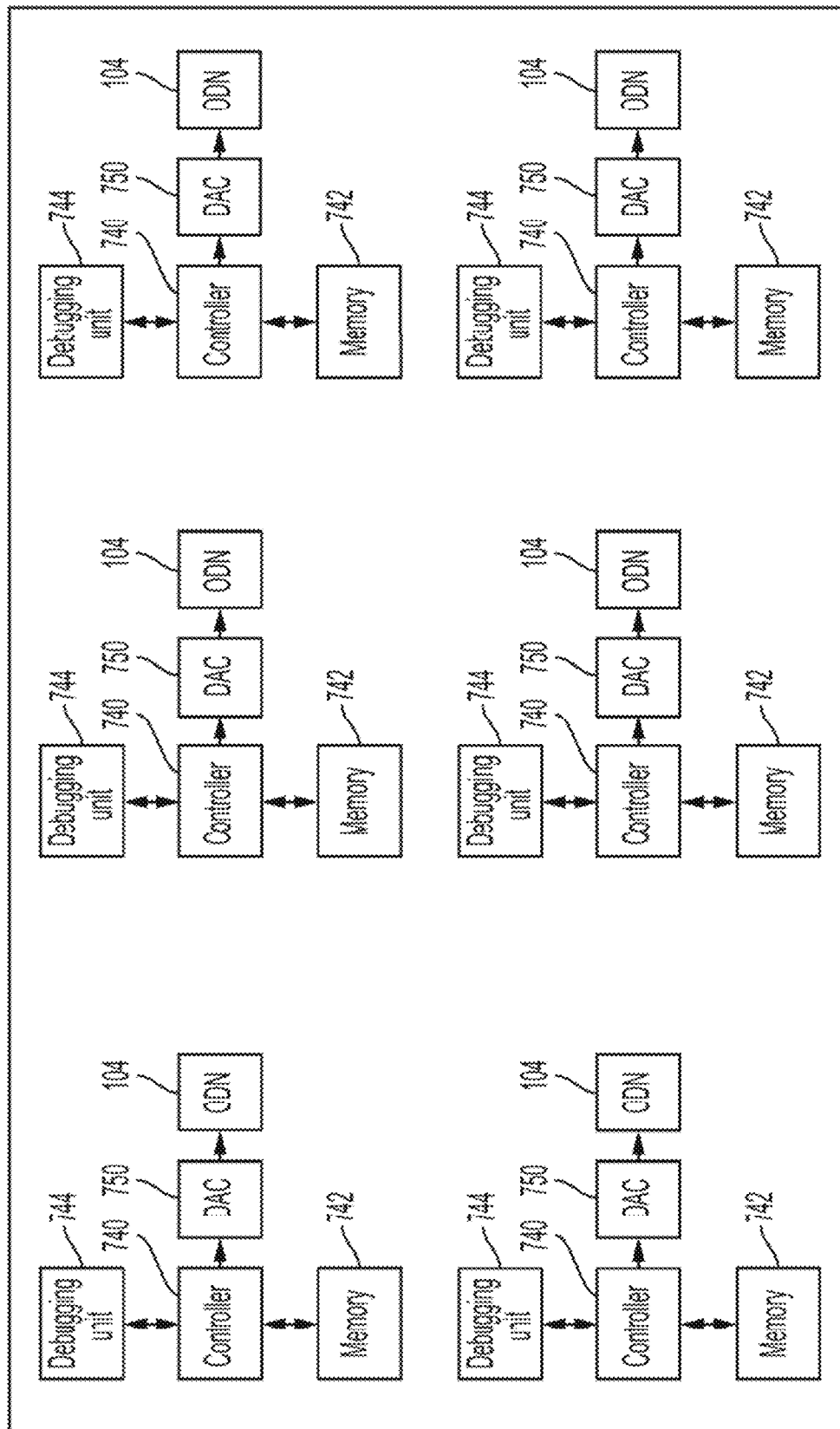
FIG. 7A illustrates a photonic communication platform including an electronic switching network, in accordance with some embodiments.

FIG. 7A illustrates a photonic substrate co-integrated (e.g., bonded or formed directly on the same substrate) with an electronic switching network. This photonic substrate includes six photonic modules arranged in a 2×3 configuration. As discussed above, each photonic module includes an optical distribution network 104. The electronic switching network includes multiple controllers 740, digital-to-analog converters (DAC) 750, memories 742 and debugging units 744. Each controller 740 controls an optical distribution network through a DAC 750. A controller 740 may control the state of the switches of an optical distribution network to dynamically reconfigure optical links as needed. Referring back to the example of FIG. 6C, a controller 740 may be used to control the states of the 2×2 switches and the 3×3 switches.

The electronic switching network may program the optical distribution networks based on data stored in the memories 742. For example, the memories may store instructions that, when executed, cause the optical distribution networks to perform a predefined switching sequence. Alternatively, the memories may store instructions that, when executed, cause the optical distribution networks to dynamically optimize the optical links based on the needs of a particular application. In some embodiments, the electronic switching network may monitor usage of the optical links, and may determine which optical links are being used and which optical links are available, or which optical links can provide a bandwidth in excess of a threshold bandwidth. The electronic switching network may use this information to decide how to allocate optical links to particular data streams. This may be particularly useful in photonic communication platforms connecting, for example, hundreds of memory dies and processors. Such photonic communication platforms can rely on the electronic switching network to determine the optimal optical path allowing a particular processor die to access information from a particular memory die. Machine learning algorithms may be used in some embodiments to identify optimal optical links.

In some embodiments, an electronic switching network is configured to perform the following steps. At a first time, the electronic switching network programs the optical switches of a photonic substrate to form a first optical communication path coupling together a first subset of the plurality of dies (e.g., coupling a first die to a second die). Programming the optical switches at the first time may involve changing the states of some of the switches (e.g., a first subset of the switches) without changing the states of other switches, or may involve changing the states of all the switches. At a second time subsequent to the first time, the electronic switching network programs the optical switches to form a second optical communication path coupling together a second subset of the plurality of dies (e.g., a third die to the first die or a third die to a fourth die). The electronic switching network may continue to reprogram the optical switches as needed. Programming the optical switches at the second time may involve changing the states of some of the switches (e.g., the first subset of the switches or a second subset of the switches) without changing the states of other switches, or may involve changing the states of all the switches. Changing the state of a switch may involve any of the following operations: changing an outputs of the switch from an off-state to an on-state, changing an output of the switch from an off-state to a partially on-state (e.g., a state in which the switch delivers a fraction of the input power to the output and a fraction of the input power to one or more other outputs), changing an output of the switch from an on-state to a partially on-state, changing an output of the switch from an on-state to an off-state, selecting one or more inputs of the switch that were previously unselected, and/or unselecting one or more inputs of the switch that were previously selected.

Figure 7B:
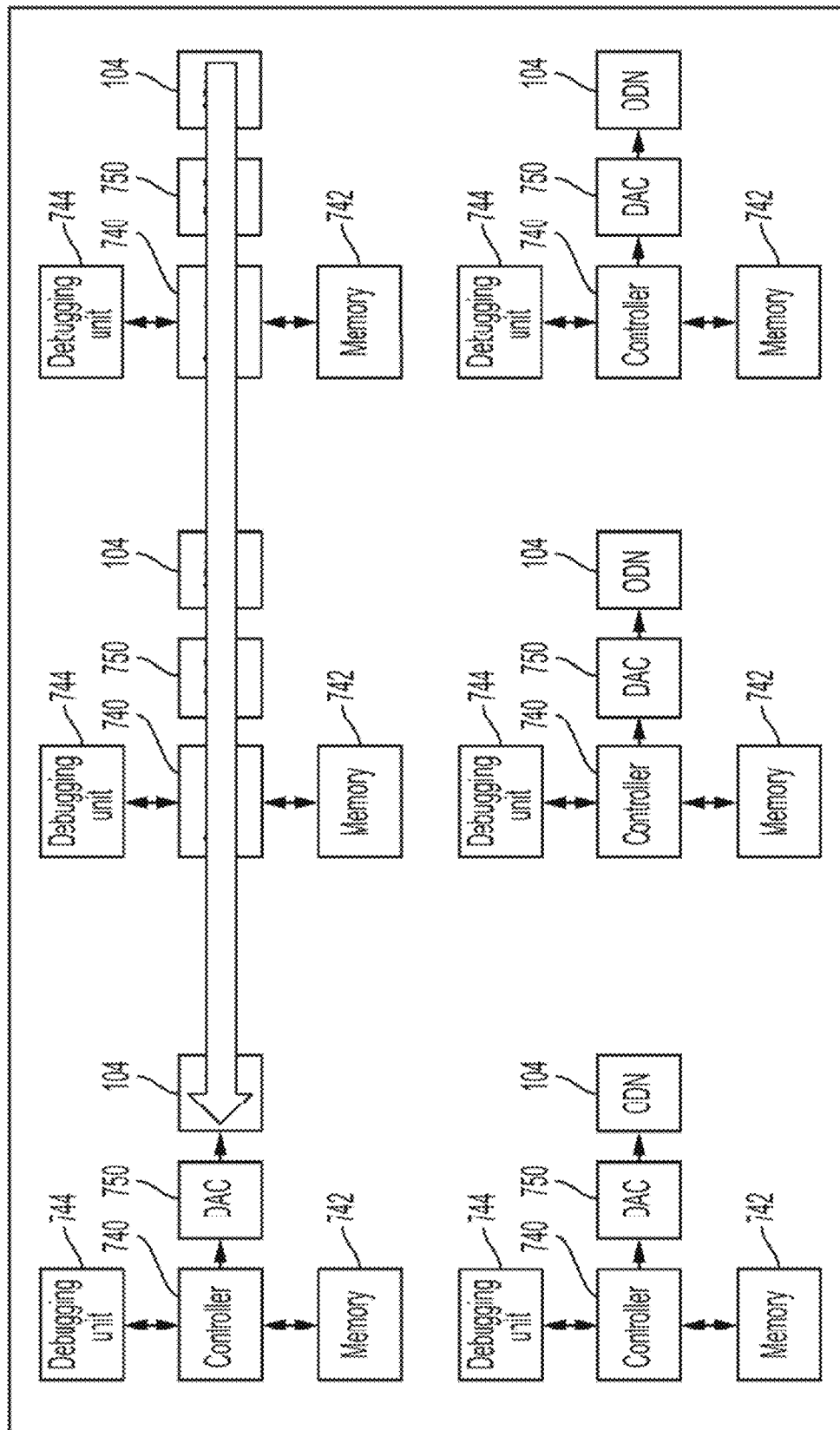
FIG. 7B illustrates the photonic communication platform of FIG. 7A controlled to form a first optical path, in accordance with some embodiments.
Figure 7C:
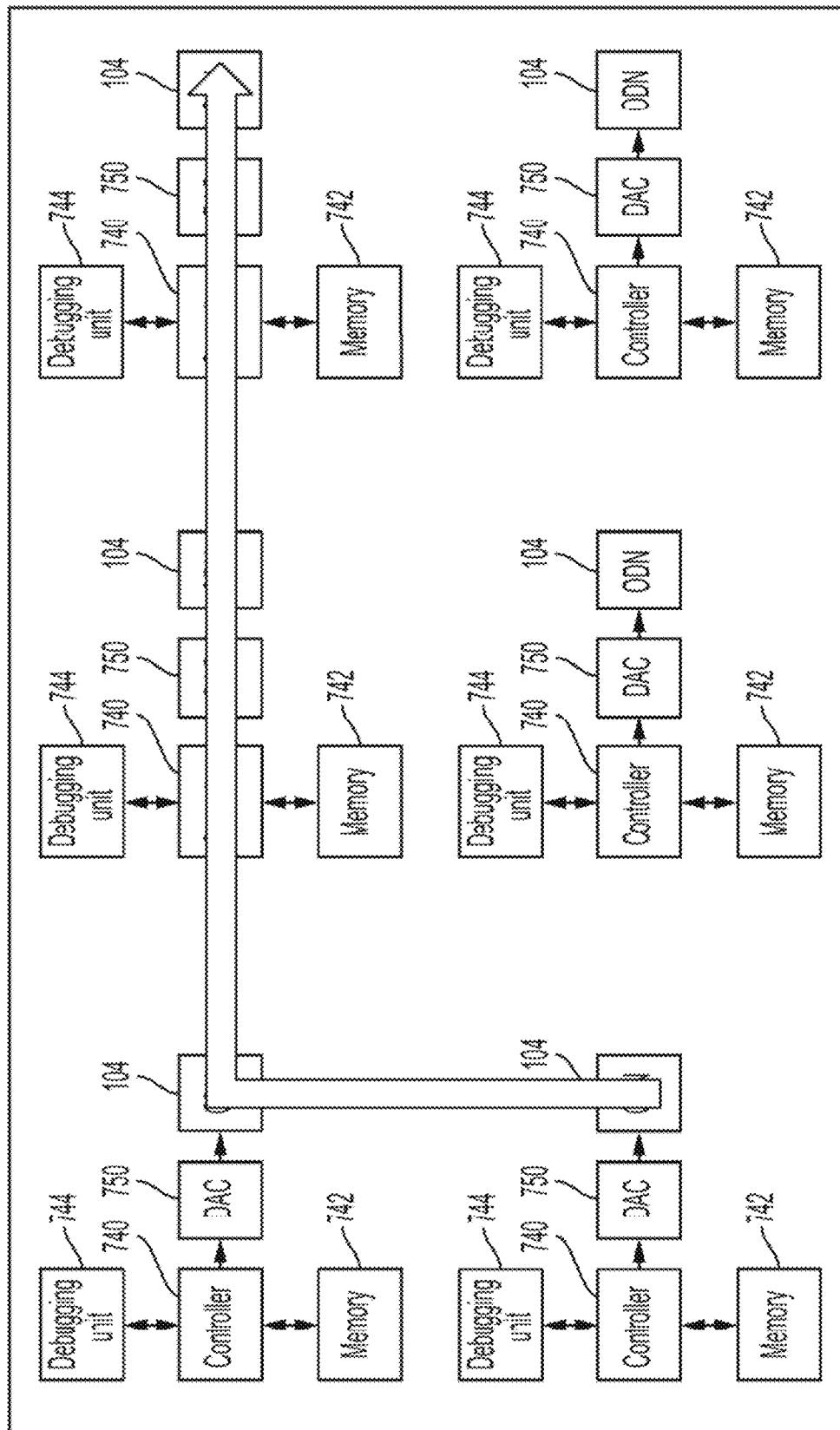
FIG. 7C illustrates the photonic communication platform of FIG. 7A controlled to form a second optical path, in accordance with some embodiments.

In the example of FIG. 7B, the electronic switching network has programmed the photonic substrate to form an optical path from a first die to a second die. Subsequently, as shown in FIG. 7C, the electronic switching network has reprogrammed the photonic substrate to form an optical path from a third die to the first die. In some embodiments, an electronic switching network can leverage wavelength division multiplexing and/or time division multiplexing to program the optical distribution networks.

A typical connection between nodes may begin with a request message on the electronic switching network. The request may be arbitrated through a mesh of electronic switches to establish a connection. At each network hop, the optical link is made once the electrical request wins arbitration. Once the connection is fully established between the source and destination, an acknowledgement is returned to the requester on the electronic network and data transmission proceeds over the optical link Controllers 740 may use debugging units 744 to perform testing, diagnosis and fault isolation of metal traces, contacts, pins, pads, etc. In some embodiments, the debugging units are implemented using the Joint Test Action Group (JTAG) industry standard. In some embodiments, manufacturing defects could result in non-functional communications channels. Redundant connections (optical and/or electrical) can be included and mapped in as replacements so that platforms with small numbers of defects need not be discarded.

The ability to dynamically reconfigure a photonic communication platform in a dynamic fashion allows the electronic switching network to operate at relatively low bandwidths, thus leading to relatively low power consumption. Being low power is particularly beneficial when the amount of data carried over the photonic modules between switching events is relatively large. Being low power, in some embodiments, opens the opportunity for "always-on" operations that can monitor training or reconfiguration sequences.

In some embodiments, the power and fidelity of an optical signal that propagates across multiple photonic modules may depend upon the number of waveguide crossings that the signal crosses. Thus, the farther an optical signal has to travel the larger the power consumption and the lower the fidelity. Recognizing this issue, the inventors have developed configurations that can adaptively select encoding schemes with larger or smaller alphabets (more or less bits per symbol) depending upon the number of photonic module boundaries that a signal is supposed to cross or an expected optical loss, or any other characteristic of an optical path. For example, when only a few crosses or small amounts of losses are expected, an encoding scheme with a larger alphabet can be used. Examples of such encoding schemes include quadrature amplitude modulation (QAM) that use a constellation of 16 points (16-QAM), 64 points (64-QAM), or 256 points (256-QAM), and pulse-amplitude modulation (PAM) with many levels, e.g. PAM-16 or PAM-32. Vice versa, when many crosses or large amounts of losses are expected, an encoding scheme with a smaller alphabet can be used. Examples of such encoding schemes include binary phase shift keying (BPSK) or PAM with few levels, e.g. PAM-2 or PAM-4, In some embodiments, the bandwidth of an optical path may be set depending upon changing communication patterns, or depending upon the number of photonic module boundaries that a signal is supposed to cross.

Clocking of the electronic switching network can be done using a single distributed clock. The clock phase may be tuned in the photonics domain to achieve extremely low jitter at each receiver. This avoids the need for an embedded clock and thus the data may not need to be encoded. Non-encoded data allows for increased bandwidth, reduced latency, and reduced power.

VII. Computing Systems Based on Photonic Communication Platforms

Computing systems may be formed that leverage the photonic communication platforms described herein. Unlike electronic distribution networks, these optical communication platforms can provide copies of the same message to multiple locations simultaneously without incurring problems arising due to parasitic impedance. This characteristic allows the optical distribution networks to form multicast and/or broadcast communications schemes. The optical distribution networks can be dynamically reconfigured to route messages to a single node or multiple nodes. Leveraging the broadcast and/or multicast capability, some embodiments enable performance of MapReduce operations directly using an optical communication platform.

Computing systems of these types may be used in a variety of applications, including for example in high-performance computing, neural, machine learning and deep learning networks, graphics rendering, large-scale visualization, gaming, high-frequency trading and video streaming, among others.

Figure 8A:
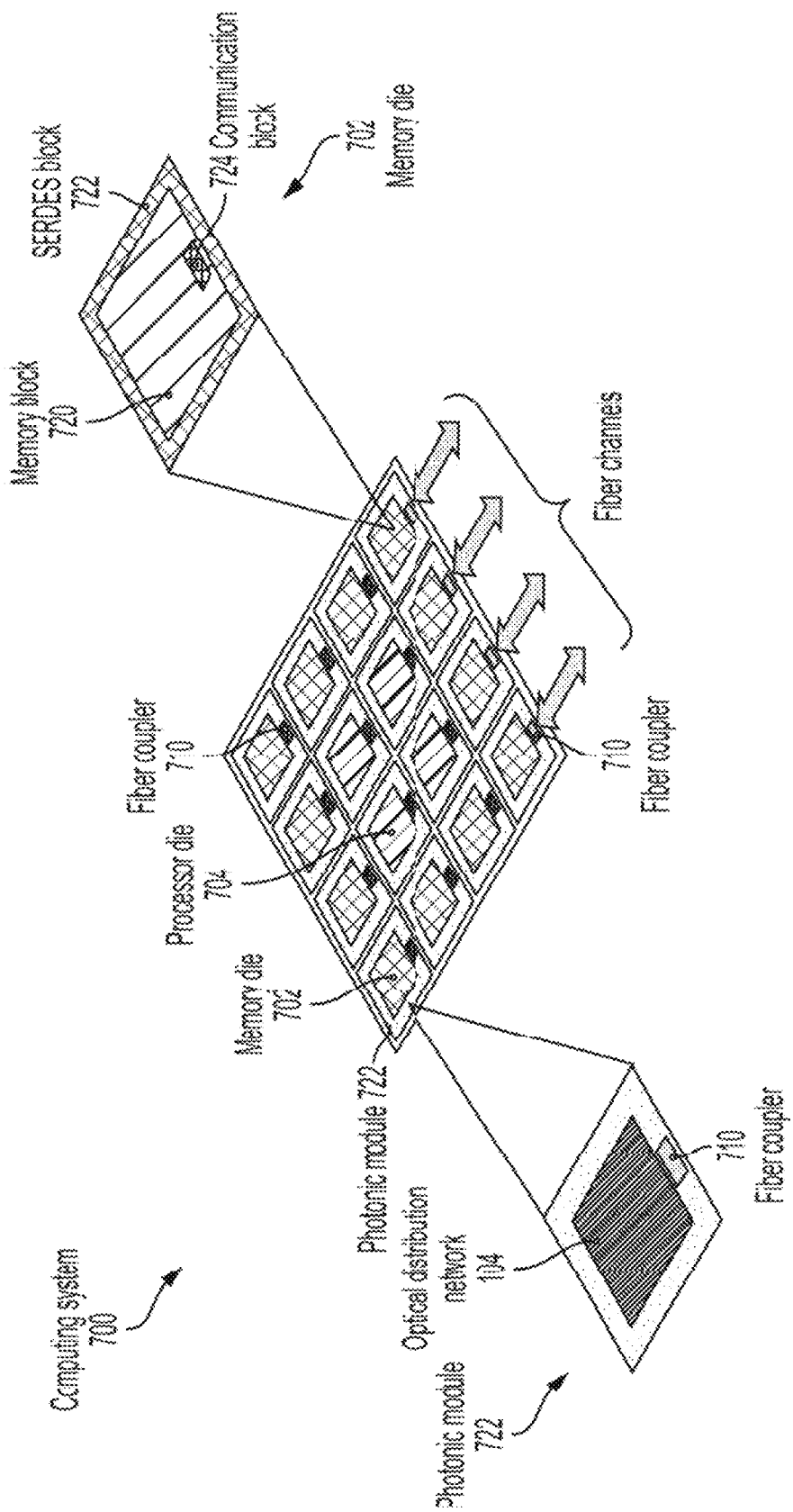
FIG. 8A illustrates a computing system based on a photonic communication platform, in accordance with some embodiments.

FIG. 8A illustrates an example computing system 800. This computing system is formed on a 4×4 photonic substrate. Of course, other dimensions and topologies are also possible. In this example, there are four processor dies 704 positioned in the middle of the photonic substrate and twelve memory dies 702 surrounding the processor dies. Each die is mounted to a photonic module. Each die communicates with the respective photonic module using for example out-of-plane couplers (e.g., as illustrated in FIG. 3B or FIG. 3C). Other embodiments may include different numbers of processors and different numbers of memories, and/or may include other types of dies, including for example, analog accelerators, photonic accelerators, photonic memories, networking chips, etc. In some embodiments, computing system 800 is disposed on an interposer, and may communicate with the interposer using through-silicon vias.

The bottom inset of FIG. 8A illustrates a photonic module 722 in additional detail. Photonic module 722 may be implemented using (or include) any of the photonic modules described above. For example, photonic module 722 includes an optical distribution network 104. Photonic module 722 may further include waveguides (not illustrated in FIG. 8A) allowing for optical communication with neighboring photonic modules (see for example waveguides 111-114 of FIG. 3A). Photonic module 722 further includes at least one fiber coupler 710, which may include an edge coupler and/or an out-of-plane coupler. Fiber coupler 710 can be coupled to the end of an optical fiber, thus enabling communication with other systems. Edge couplers enable optical coupling in the plane of the photonic module. Examples of edge couplers include tapered waveguides, v-grooves and U-grooves. In some embodiments, an edge coupler includes simply the end of a waveguide at an edge of the photonic substrate. By contrast, out-of-plane couplers (e.g., grating couplers and prisms) enable optical coupling outside the plane of the photonic chip. This particular computing system is arranged so that the lowermost photonic modules are connected to optical fibers (as indicated by the label "fiber channels"). Photonic module 722 may further include one or more out-of-plane couplers (not shown in FIG. 8A) enabling optical communication with the die mounted to the photonic module (see for example out-of-plane coupler 105 of FIG. 3A).

The top inset of FIG. 8A illustrates a memory die 702 in additional detail. Memory die 702 includes a memory block 720, which includes several memory units (e.g., solid state memories such as NAND, DRAM, SRAM, HBM, etc.). Memory dies 702 further includes a communication block 724, which may include optical components for communicating with photonic modules to which the memory die is mounted. For example, communication block 724 may include an out-of-plane coupler that couples with an out-of-plane coupler of the photonic module. Memory die 702 further includes a serializer/deserializer (SERDES) block 722. SERDES block 722 convert data from serial to parallel and vice versa. In this particular implementation, the SERDES block is positioned near the outer edge of memory die 702 and memory block 720 is positioned in the middle of the memory die. Of course, other arrangements are possible. Although FIG. 8A does not illustrate a processor die 704 in detail, processor dies may also include out-of-plane couplers that couple with the out-of-plane couplers of the respective photonic modules.

The computing systems described in connection with FIG. 8A may be used as a stand-alone computing system, or may be used in combination with other computing systems. Combinations of computing systems are referred to herein a multi-node computing systems. FIG. 8B illustrates an example of a multi-node computing system including four computing systems 800. Other multi-node computing systems may include many computing systems, for example in the tens or hundreds of units, or more. Optical fibers 712 are used to place the computing systems in communication with one another. Each end of an optical fiber couples to a fiber coupler 710 of a computing system 800. In this example, the computing systems of the multi-node computing system share the same layout (same numbers of photonic modules, processor dies and memory dies). However, not all embodiments are limited in this respect. In some embodiments, the communication between the many multi-node computing systems can be done electronically by the use of silicon interposers. This communication strategy may consume a reasonably small amount of power if the computing systems are placed adjacent to one another or within centimeters apart to reduce capacitance and other parasitic resistance.

The inventors have further appreciated that optical modules of the types described herein may serve as transceivers enabling communication from a computing system to another computing system or from a computer system to a host. This transceiver may be optical or electronic. Example optical interfaces include board-to-board communication via optical fibers or remote rack-to-rack communication utilizing higher level protocols such as Ethernet or Infiniband. Electronic interfaces to a host system include SERDES-based standards such as PCI Express. An external I/O module may manage communications between the host and a local system. This includes direct memory access offload capabilities for high speed data movement between remote and local memories. The external I/O module may further provide local interfaces for management, calibration, boot, and reliability and serviceability (RAS).

Optical communication platforms of the types described herein can provide layered network stacks. One example stack is configured as follows. A physical layer includes optical interconnects including optical-to-electrical converters, electrical-to-optical converters, and optical distribution networks. A datalink layer includes an electronic switching network allowing connections between modules. In some embodiments, communication between nodes of a network may begin with a request message on the electronic switching network. The datalink layer processes this request and arbitrates through a mesh of electrical switches to establish a connection. At each photonic module boundary, an optical link is formed if the request wins the arbitration. Once the connection is fully established between the source and the destination, an acknowledgement may be returned to the requester on the electronic switching network and data transmission proceeds over the photonic modules. A transport layer involves packetization, data integrity, and buffer allocation. The transport layer uses packetization to implement upper layer protocols on the datalink layer. Flow control may be implemented with buffer credits. If reliability dictates additional protection from errors at the physical layer, data integrity including cyclic redundancy checks (CRC) (e.g., resend) and/or forward error correction (FEC) schemes can be used.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A photonic system, comprising:
a semiconductor photonic substrate lithographically patterned with a plurality of photonic modules, each photonic module being configured to bond to a respective electronic die of a plurality of electronic dies, each photonic module comprising:
an electrical connection configured to electrically couple the photonic module to electronic circuitry formed on the respective electronic die when the respective electronic die is bonded to the semiconductor photonic substrate;
an optical distribution network configured to selectively route signals among the plurality of electronic dies when the electronic dies are bonded to the semiconductor photonic substrate;
a waveguide optically coupling the optical distribution network to a waveguide of a neighboring photonic module that is adjacent to the photonic module; and
a plurality of transistors, wherein the waveguide and the plurality of transistors are embedded in a common material layer.

2. The photonic system of claim 1, wherein the photonic modules are copies of each other.

3. The photonic system of claim 1, wherein the waveguide of the photonic module is physically connected to the waveguide of the neighboring photonic module.

4. The photonic system of claim 1, wherein a gap is defined between the waveguide of the photonic module and the waveguide of the neighboring photonic module, wherein the waveguide of the photonic module and the waveguide of the neighboring photonic module are optically coupled to each other across the gap.

5. The photonic system of claim 1, wherein a first photonic module of the plurality of photonic modules is configured to bond to a processor die and a second photonic module of the plurality of photonic modules is configured to bond to a memory die.

6. The photonic system of claim 1, wherein at least one photonic module of the plurality of photonic modules is configured to bond to a vertically stacked memory.

7. The photonic system of claim 1, wherein at least one photonic module of the plurality of photonic modules is configured to bond to more than one electronic die.

8. The photonic system of claim 1, wherein the photonic modules are arranged in a 2-dimensional grid.

9. The photonic system of claim 1, wherein each photonic module further comprises a transceiver optically coupled to the optical distribution network, the transceiver comprising an optical-to-electrical converter and an electrical-to-optical converter.

10. The photonic system of claim 9, wherein the optical-to-electrical converter and the electrical-to-optical converter are configured to couple to the electronic circuitry formed on the respective electronic die when the respective electronic die is bonded to the semiconductor photonic substrate.

11. A computing system, comprising:
  a plurality of electronic dies comprising at least a processor die and a first memory die; and
  a semiconductor photonic substrate lithographically patterned with a plurality of photonic modules, wherein the plurality of photonic modules comprise at least first and second photonic modules that are adjacent to each other, wherein the processor die is mounted on the first photonic module and the first memory die is mounted on the second photonic module, wherein the first photonic module comprises:
    an electrical connection electrically coupling the first photonic module to electronic circuitry formed on the processor die;
    an optical distribution network configured to selectively route signals between the processor die and other electronic dies of the plurality of electronic dies;
    a waveguide optically coupling the optical distribution network to a waveguide of the second photonic module; and
    a plurality of transistors, wherein the waveguide and the plurality of transistors are embedded in a common material layer.

12. The computing system of claim 11, wherein the plurality of electronic dies further comprise a second memory die and the plurality of photonic modules further comprise a third photonic module, wherein the second memory die is mounted on the third photonic module, and wherein the optical distribution network of the first photonic module is configured to selectively route signals between the processor die and either the first memory die or the second memory die.

13. The computing system of claim 11, wherein the photonic modules are copies of each other.

14. The computing system of claim 11, wherein the waveguide of the first photonic module is physically connected to the waveguide of the second photonic module.

15. The computing system of claim 11, wherein a gap is defined between the waveguide of the first photonic module and the waveguide of the second photonic module, wherein the waveguide of the first photonic module and the waveguide of the second photonic module are optically coupled to each other across the gap.

16. The computing system of claim 11, wherein the photonic modules are arranged in a 2-dimensional grid.

17. The computing system of claim 11, wherein each photonic module further comprises a transceiver optically coupled to the optical distribution network, the transceiver comprising an optical-to-electrical converter and an electrical-to-optical converter.

18. The computing system of claim 17, wherein the optical-to-electrical converter and the electrical-to-optical converter are coupled to the electronic circuitry formed on the processor die.

19. The photonic system of claim 1, wherein the waveguide and the plurality of transistors are formed in a common silicon layer.

20. The computing system of claim 11, wherein the waveguide and the plurality of transistors are formed in a common silicon layer.

* * * * *